United States Patent
Ku et al.

(10) Patent No.: US 11,469,372 B2
(45) Date of Patent: *Oct. 11, 2022

(54) MEMORY CELL WITH TOP ELECTRODE VIA

(71) Applicant: Taiwan Semiconductor Manufacturing Co., Ltd., Hsin-Chu (TW)

(72) Inventors: Ming-Che Ku, Hsinchu (TW); Harry-Hak-Lay Chuang, Zhubei (TW); Hung Cho Wang, Taipei (TW); Tsun Chung Tu, Tainan (TW); Jiunyu Tsai, Hsinchu (TW); Sheng-Huang Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 174 days.

This patent is subject to a terminal disclaimer.

(21) Appl. No.: 17/009,887

(22) Filed: Sep. 2, 2020

(65) Prior Publication Data

US 2020/0403146 A1    Dec. 24, 2020

Related U.S. Application Data

(63) Continuation of application No. 16/416,555, filed on May 20, 2019, now Pat. No. 10,790,439.

(Continued)

(51) Int. Cl.
*H01L 43/02*    (2006.01)
*H01F 10/32*    (2006.01)
(Continued)

(52) U.S. Cl.
CPC ......... *H01L 43/02* (2013.01); *H01F 10/3254* (2013.01); *H01F 41/34* (2013.01);
(Continued)

(58) Field of Classification Search
CPC ... H01L 27/228; H01L 23/5329; H01L 43/12; H01L 23/528; H01L 43/02;
(Continued)

(56) References Cited

U.S. PATENT DOCUMENTS 10,790,439 B2 *  9/2020  Ku .................. H01L 21/76802
2016/0225979 A1   8/2016  Hsu et al.
(Continued)

OTHER PUBLICATIONS

Non-Final Office Action dated Jan. 9, 2020 for U.S. Appl. No. 16/416,555.
(Continued)

*Primary Examiner* — Caleen O Sullivan
(74) *Attorney, Agent, or Firm* — Eschweiler & Potashnik, LLC

(57) ABSTRACT

The present disclosure relates to an integrated chip. The integrated chip includes a memory device surrounded by a dielectric structure disposed over a substrate. The memory device includes a data storage structure disposed between a bottom electrode and a top electrode. A top electrode via couples the top electrode to an upper interconnect wire. A first line is tangent to a first outermost sidewall of the top electrode via and a second line is tangent to an opposing second outermost sidewall of the top electrode via. The first line is oriented at a first angle with respect to a horizontal plane that is parallel to an upper surface of the substrate and the second line is oriented at a second angle with respect to the horizontal plane. The second angle is less than the first angle.

20 Claims, 17 Drawing Sheets

Related U.S. Application Data

(60) Provisional application No. 62/702,581, filed on Jul. 24, 2018.

(51) Int. Cl.

| | | |
|---|---|---|
| *H01F 41/34* | (2006.01) | |
| *H01L 21/768* | (2006.01) | |
| *H01L 23/522* | (2006.01) | |
| *H01L 23/528* | (2006.01) | |
| *H01L 27/22* | (2006.01) | |
| *H01L 43/12* | (2006.01) | |
| *G11C 11/16* | (2006.01) | |

(52) U.S. Cl.
CPC .. *H01L 21/76802* (2013.01); *H01L 21/76877* (2013.01); *H01L 23/5226* (2013.01); *H01L 23/5283* (2013.01); *H01L 27/228* (2013.01); *H01L 43/12* (2013.01); *G11C 11/161* (2013.01)

(58) Field of Classification Search
CPC ........... H01L 21/7684; H01L 21/76802; H01L 21/76877; H01L 23/5226; H01L 23/5283; H01L 21/76816; H01L 21/76808; H01L 21/76811; H01L 21/76804; H01L 43/08; H01L 27/222; H01F 41/32; H01F 10/3259; H01F 10/3254; H01F 41/34; G11C 11/161

USPC ........................................................ 257/427
See application file for complete search history.

(56) References Cited

U.S. PATENT DOCUMENTS

| | | |
|---|---|---|
| 2016/0315086 A1 | 10/2016 | Yoon et al. |
| 2017/0170386 A1 | 6/2017 | Chuang et al. |
| 2017/0256445 A1 | 9/2017 | Chou et al. |
| 2017/0263850 A1 | 9/2017 | Ito |
| 2020/0006638 A1 | 1/2020 | Chen et al. |

OTHER PUBLICATIONS

Notice of Allowance dated Apr. 29, 2020 for U.S. Appl. No. 16/416,555.

\* cited by examiner

US 11,469,372 B2

MEMORY CELL WITH TOP ELECTRODE VIA

REFERENCE TO RELATED APPLICATIONS

This Application is a Continuation of U.S. application Ser. No. 16/416,555, filed on May 20, 2019, which claims the benefit of U.S. Provisional Application No. 62/702,581, filed on Jul. 24, 2018. The contents of the above-referenced patent Applications are hereby incorporated by reference in their entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Magnetic random-access memory (MRAM) devices are one promising candidate for a next generation non-volatile memory technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
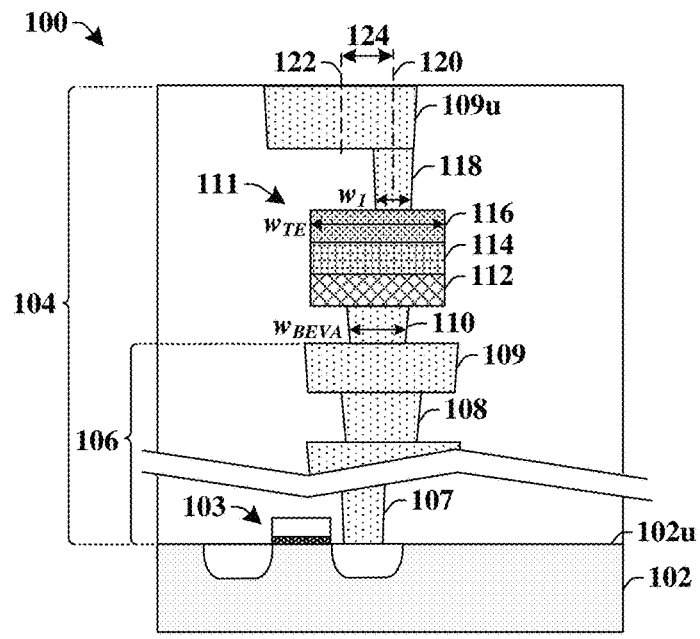
FIG. 1 illustrates a cross-sectional view of some embodiments of an integrated chip having a magnetoresistive random access memory (MRAM) cell comprising a top electrode via with a smaller width than an underlying bottom electrode via.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetoresistive random-access memory (MRAM) devices comprise a magnetic tunnel junction (MTJ) vertically arranged within a back-end-of-the-line (BEOL) metal stack between a bottom electrode and a top electrode. The MTJ comprises a pinned layer and a free layer, which are vertically separated by a tunnel barrier layer. The magnetic orientation of the pinned layer is static (i.e., fixed), while a magnetic orientation of the free layer is capable of switching between a parallel configuration and an anti-parallel configuration with respect to that of the pinned magnetic layer. The parallel configuration provides for a low resistance state that digitally stores data as a first data state (e.g., a logical "0"). The anti-parallel configuration provides for a high resistance state that digitally stores data as a second data state (e.g., a logical "1").

The top electrode of an MRAM device is generally connected to an overlying interconnect wire by way of a top electrode via. The top electrode via may be formed by etching a via hole into an inter-level dielectric (ILD) layer over the top electrode and subsequently filling the via hole with a conductive material. The via hole may be etched according to a patterned masking layer, such that a size of a top electrode via is generally defined by characteristics of a photolithography system. It has been appreciated that a top electrode via having a relatively small size is easier to land on the top electrode. It has also been appreciated that if the top electrode via is too large, the via hole may extend over sides of the top electrode. Due to etching selectivity between the top electrode and surrounding dielectric layers, a subsequently formed top electrode via can contact an MTJ under the top electrode, leading to shorting of the MTJ and failure of the MRAM device.

Because the size of a top electrode via is relatively small, the top electrode via is generally produced as a feature with a greatest precision on a photomask (e.g., a minimum feature size of a photomask). However, because of this, the top electrode via is subject to critical dimension (CD) tolerances (e.g., a maximum allowed deviation in size from a target of a feature). As the size of MRAM cells continue to decrease, the CD tolerance of the bottom of the top electrode vias also increases and makes landing the top electrode via on an underlying top electrode increasingly difficult. The increasing difficulty in landing the top electrode via on the top electrode can lead to over-etching that can cause device failure and reduced yield.

The present disclosure, in some embodiments, relates to an integrated chip having an MRAM cell comprising a top electrode via with a size that is smaller than a minimum feature size defined by a characteristics of a photolithography system, and an associated method of formation. The integrated chip may comprise a magnetoresistive random access memory (MRAM) device surrounded by a dielectric structure disposed over a substrate. The MRAM device comprises a magnetic tunnel junction between a bottom electrode and a top electrode. A bottom electrode via couples the bottom electrode to an underlying conductive interconnect wire. A top electrode via couples the top electrode to an overlying interconnect wire. A bottom surface of the top electrode via has a smaller width than a bottom surface of the bottom electrode via. The smaller width of the bottom surface of the top electrode via allows for the top electrode via to more easily land on the top electrode during fabrication of the MRAM device, thereby preventing over-etching that can cause damage to the MRAM device.

FIG. 1 illustrates a cross-sectional view of some embodiments of an integrated chip 100 having a magnetoresistive random-access memory (MRAM) cell with a top electrode via having a smaller width than an underlying bottom electrode via.

The integrated chip 100 comprises a magnetoresistive random access memory (MRAM) device 111 disposed within a dielectric structure 104 over a substrate 102. The MRAM device 111 comprises a magnetic tunnel junction (MTJ) 114 disposed between a bottom electrode 112 and a top electrode 116. The MRAM device 111 is configured to store a data state based upon a resistive value of the MRAM device 111. For example, the MRAM device 111 will either store a first data state (e.g., a logical "0") if the MRAM device 111 has a low resistance state or a second data state (e.g., a logical "1") if the MRAM device 111 has a high resistance state. During operation, the MTJ 114 can be changed between the lower resistance state and the high resistance state through the tunnel magnetoresistance (TMR) effect.

A bottom electrode via 110 is arranged below the MRAM device 111. The bottom electrode via 110 is configured to couple the MRAM device 111 to one or more lower interconnect layers 106 disposed within the dielectric structure 104 between the MRAM device 111 and the substrate 102. In some embodiments, the one or more lower interconnect layers 106 may comprise a conductive contact 107, and alternating layers of interconnect vias 108 and interconnect wires 109. The one or more lower interconnect layers 106 are further coupled to an access device 103 arranged within the substrate 102.

The top electrode 116 is coupled to an upper interconnect wire 109u, which overlies the MRAM device 111, by way of a top electrode via 118. The top electrode via 118 is centered along a first axis 120 that is perpendicular to an upper surface 102u of the substrate 102. The upper interconnect wire 109u is centered along a second axis 122 that is perpendicular to the upper surface 102u of the substrate 102 and that is separated from the first axis 120 by a non-zero distance 124.

The top electrode via 118 has a bottom surface with a first width $w_1$. The first width $w_1$ is less than a width $w_{TE}$ of the top electrode 116. For example, the $1^{st}$ width $w_1$ may be less than ⅓ the width $w_{TE}$ of the top electrode 116. In some embodiments, the first width $w_1$ may also be less than a width $w_{BEVA}$ of a bottom surface of the bottom electrode via 110. In some embodiments, the first width $w_1$ of the top electrode via 118 is smaller than a minimum feature size of a photomask used in a photolithography system (e.g., a photolithography system using 193 nm illumination) to form the top electrode via 118.

The smaller width of the bottom surface of the top electrode via 118 allows for the top electrode via 118 to more easily land on the top electrode 116 during fabrication of the MRAM device 111, thereby preventing over-etching that can cause damage to the MRAM device 111.

Figure 2A:
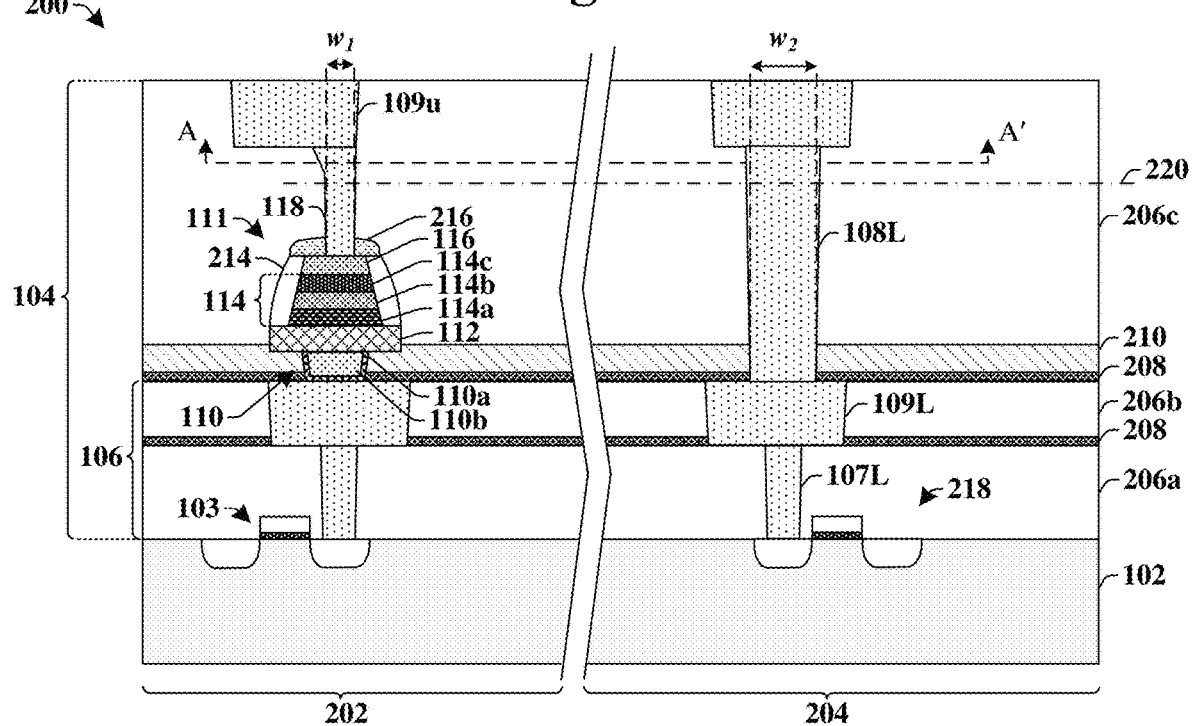
FIGS. 2A-2B illustrate some embodiments of an integrated chip having an MRAM cell comprising a top electrode via with a smaller width than an underlying bottom electrode via.
Figure 2B:
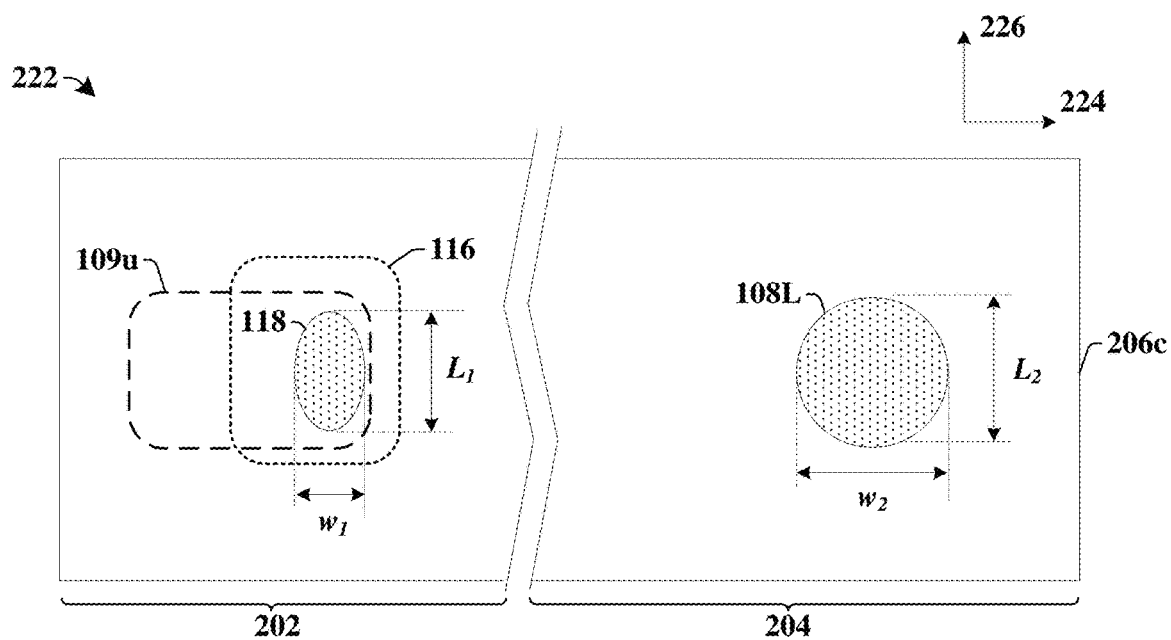

FIGS. 2A-2B illustrate some additional embodiments of an integrated chip having an MRAM cell comprising a top electrode via with a smaller width than an underlying bottom electrode via.

As shown in cross-sectional view 200 of FIG. 2A, the integrated chip comprises a substrate 102 including an embedded memory region 202 and a logic region 204. A dielectric structure 104 is arranged over the substrate 102. The dielectric structure 104 comprises a plurality of stacked inter-level dielectric (ILD) layers 206a-206c vertically separated by etch stop layers 208. In some embodiments, the plurality of stacked ILD layers 206a-206c may comprise one or more of silicon dioxide, SiCOH, a fluorosilicate glass, a phosphate glass (e.g., borophosphate silicate glass), or the like. In some embodiments, the etch stop layers 208 may comprise a nitride (e.g., silicon nitride), a carbide (e.g., silicon carbide), or the like.

Within the embedded memory region 202, one or more lower interconnect layers 106 are disposed within one or more lower ILD layers 206a-206b. The one or more lower interconnect layers 106 are coupled to an access device 103 arranged within the substrate 102 and to a bottom electrode via 110 arranged within the dielectric structure 104. The bottom electrode via 110 couples the one or more lower interconnect layers 106 to an MRAM device 111 surrounded by the dielectric structure 104. In some embodiments, the access device 103 may comprise a transistor device (e.g., a MOSFET, a bi-polar junction transistor (BJT), a high electron mobility transistor (HEMT), or the like). In some embodiments, one or more lower interconnect layers 106 may comprise copper, aluminum, or the like. In some embodiments, the bottom electrode via 110 may comprise a liner 110a (e.g., a glue layer and/or a diffusion barrier layer) and a conductive material 110b. In some embodiments, the liner 110a may comprise tantalum nitride, titanium nitride, or the like. In some embodiments, the conductive material 110b may comprise titanium, tantalum, tantalum nitride, titanium nitride, or the like.

The MRAM device 111 comprises a magnetic tunnel junction (MTJ) 114 disposed between a bottom electrode 112 and a top electrode 116. The bottom electrode 112 is disposed over the bottom electrode via 110. In some embodiments, the bottom electrode 112 and the top electrode 116 may comprise tantalum, tantalum nitride, titanium, titanium nitride, or the like. In some embodiments, the top electrode 116 may have a width that is in a range of between approximately 50 nm and approximately 100 nm.

The MTJ 114 includes a lower ferromagnetic layer 114a and an upper ferromagnetic layer 114c, which are separated from one another by a tunneling barrier layer 114b. In some embodiments, the lower ferromagnetic layer 114a may comprise a pinned layer having a magnetization that is fixed, while the upper ferromagnetic layer 114c may comprise a free layer having a magnetization that can changed to be either parallel (P state) or anti-parallel (AP state) with respect to the magnetization of pinned layer. In some embodiments, the lower ferromagnetic layer 114a and the upper ferromagnetic layer 114c may comprise iron, cobalt, nickel, iron cobalt, nickel cobalt, cobalt iron boride, iron boride, iron platinum, iron palladium, or the like. In some embodiments, the tunneling barrier layer 114b may comprise magnesium oxide (MgO), aluminum oxide (e.g., Al$_2$O$_3$), nickel oxide, gadolinium oxide, tantalum oxide, molybdenum oxide, titanium oxide, tungsten oxide, or the like.

In some embodiments, a lower insulating structure 210 may be disposed over the one or more lower ILD layers 206a-206b. The lower insulating structure 210 comprises sidewalls defining an opening between the bottom electrode 112 and the one or more lower interconnect layers 106. The bottom electrode via 110 extends through the opening in the lower insulating structure 210. In various embodiments, the lower insulating structure 210 may comprise one or more of silicon nitride, silicon dioxide, silicon carbide, Tetraethyl orthosilicate (TEOS), or the like.

Sidewall spacer 214 are disposed along opposing sides of the MTJ 114 and the top electrode 116. The sidewalls spacers 214 may have curved outermost sidewalls facing away from the MTJ 114. In various embodiments, the sidewalls spacers 214 may comprise silicon nitride, a silicon dioxide (SiO$_2$), silicon oxy-nitride (e.g., SiON), or the like. In some embodiments, a mask layer 216 may be disposed over the top electrode 116 and the sidewall spacers 214. In some embodiments, the mask layer 216 may have a thickness in a range of between approximately 100 angstroms and approximately 400 angstroms. In various embodiments, the mask layer 216 may comprise silicon nitride, a silicon dioxide (SiO$_2$), silicon oxy-nitride (e.g., SiON), silicon carbide, or the like. An upper ILD layer 206c is disposed over the lower insulating structure 210 and surrounds the MRAM device 111.

A top electrode via 118 is disposed within the upper ILD layer 206c and extends through the mask layer 216 to contact the top electrode 116. The top electrode via 118 couples the top electrode 116 to an upper interconnect wire 109u. The top electrode via 118 is disposed directly on the top electrode 116. In some embodiments, the top electrode via 118 may comprise aluminum, copper, tungsten, or the like. In some embodiments, the top electrode via 118 may comprise a same material as the upper interconnect wire 109u.

In some embodiments, the top electrode via 118 has a bottom surface with a first width $w_1$. In some embodiments, the first width $w_1$ may be in a range of between approximately 25 nm and approximately 40 nm. In some additional embodiments, the first width $w_1$ may be in a range of between approximately 10 nm and approximately 30 nm. In some embodiments, a bottom of the upper interconnect wire 109u has a width that is between approximately 3 and approximately 5 times larger than the first width $w_1$. For example, in some embodiments the bottom of the upper interconnect wire 109u has a width that is in a range of between approximately 70 nm and approximately 120 nm. In some additional embodiments, the bottom of the upper interconnect wire 109u has a width that is approximately equal to 105 nm. The relatively small size of the first width $w_1$ allows for the top electrode via 118 to more easily land on the top electrode 116 during fabrication of the MRAM device 111 and prevents over-etching that can cause damage to the MRAM device 111.

Within the logic region 204, one or more additional interconnect layers are disposed within the dielectric structure 104. The one or more additional interconnect layers comprise a conductive contact 107L, an interconnect via 108L, and an interconnect wire 109L. The one or more additional interconnect layers are coupled to a logic device 218 arranged within the substrate 102. In some embodiments, the logic device 218 may comprise a transistor device (e.g., a MOSFET, a bi-polar junction transistor (BJT), a high electron mobility transistor (HEMT), or the like).

A horizontal plane 220 that is parallel to an upper surface of the substrate 102 extends through sidewalls of the top electrode via 118 and through an interconnect via 108L within the logic region 204. In some embodiments, the interconnect via 108L may extend through the lower insulating structure 210. The interconnect via 108L has a second width $w_2$ that is larger than the first width $w_1$. In some embodiments, the second width $w_2$ may be in a range of between approximately 50 nm and approximately 90 nm. In some embodiments, the first width $w_1$ may be between approximately ¼ and ¾ the second width $w_2$.

FIG. 2B illustrates a top-view 222 shown along line A-A' of cross-sectional view 200 of FIG. 2A.

As shown in top-view 222 of FIG. 2B, within the embedded memory region 202 the top electrode via 118 has an elongated shape that extends along a first direction 224 for the first width $w_1$ and that further extends along a second direction 226 for a first length $L_1$ that is greater than the first width $w_1$. In some embodiments, the elongated shape of the top electrode via 118 may be oval shaped when viewed from the top-view 222. In some embodiments, the first length $L_1$ is in a range of between approximately 150% and approximately 300% larger than the first width $w_1$. The first width $w_1$ and the first length $L_1$ cause the top electrode via 118 to have a first area when viewed from the top-view 222.

Within the logic region 204, the interconnect via 108L has a shape that is substantially symmetric about the first direction 224 and the second direction 226. The interconnect via 108L extends along the first direction 224 for the second width $w_2$ and further extends along the second direction 226 for a second length $L_2$ that is substantially equal to the second width $w_2$. In some embodiments, the interconnect via 108L has a substantially circular shape when viewed from the top-view 222. In some embodiments, the second length $L_2$ may be approximately equal to the first length $L_1$. In other embodiments, the second length $L_2$ may be smaller than the first length $L_1$. The second width $w_2$ and the second length $L_2$ cause the interconnect via 108L to have a second area when viewed from the top-view 222.

Figure 3:
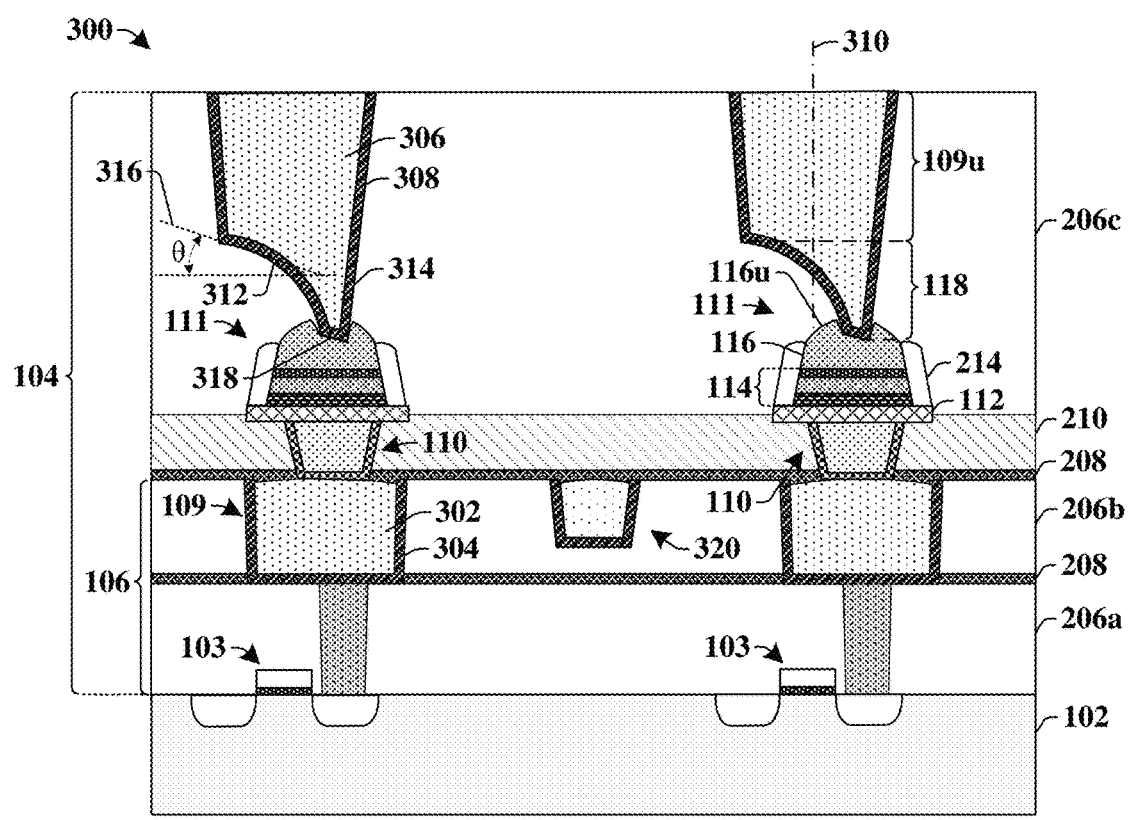
FIGS. 3-6 illustrates additional cross-sectional views of some embodiments of an integrated chip having an MRAM cell comprising a top electrode via with a smaller width than an underlying bottom electrode via.

FIG. 3 illustrate some embodiments of an integrated chip 300 having an MRAM cell comprising a top electrode via with a width that is smaller than a width of an underlying top electrode.

The integrated chip 300 comprises an MRAM device 111 disposed within a dielectric structure 104 arranged over a substrate 102. The dielectric structure 104 comprises a plurality of stacked inter-level dielectric (ILD) layers 206a-206c vertically separated by etch stop layers 208. One or more lower interconnect layers 106 are arranged within the dielectric structure 104. The one or more lower interconnect layers 106 comprise an interconnect wire 109 having a first conductive material 302 surrounded by a first liner 304 that separates the first conductive material 302 from the dielectric structure 104. In some embodiments, the first conductive material 302 may comprise tungsten, aluminum, copper, or the like. In some embodiments, the first liner 304 may comprise a diffusion barrier. In some embodiments, the first liner 304 may comprise a refractive metal or a refractive metal oxide, such as titanium, titanium-nitride, tantalum, tantalum-nitride, or the like.

The one or more lower interconnect layers 106 couple an access device 103 to a bottom electrode via 110 contacting an MRAM device 111. The MRAM device 111 comprises a bottom electrode 112 separated from a top electrode 116 by way of an MTJ 114. In some embodiments, the top electrode 116 may have a curved upper surface 116u facing away from the substrate 102. In some embodiments, the one or more lower interconnect layers 106 may further comprise a dummy structure 320 disposed at locations laterally between adjacent MRAM devices. The dummy structure 320 may have a smaller height than the interconnect wire 109. The dummy structure 320 enable a photolithography process to form lower interconnect wires at a small pitch. A lower insulating structure 210 continuously extends over the dummy structure 320.

A top electrode via 118 contacts the top electrode 116. The top electrode via 118 is further coupled to an upper interconnect wire 109u that is over the top electrode via 118. The top electrode via 118 and the upper interconnect wire 109u respectively comprise a second conductive material 306 surrounded by a second liner 308 that separates the second conductive material 306 from the dielectric structure 104. The top electrode via 118 has a cross-sectional profile that is asymmetric about a line 310 bisecting the top electrode via 118. In some embodiments, the top electrode via 118 has a curved sidewall 312 that opposes a substantially linear sidewall 314. The curved sidewall 312 has a slope that decreases as a distance from the top electrode 116 increases. In some embodiments, the curved sidewall 312 may extend along a line 316 that is oriented at an angle θ of less than approximately 30° with respect to a horizontal plane that is parallel to an upper surface of the substrate 102. In some embodiments, the line 316 is oriented at an angle θ that is between approximately 10° and approximately 30°.

In some embodiments, a bottommost surface 318 of the top electrode via 118 contacts the top electrode 116 at a position that is below a top of the top electrode 116. In some such embodiments, the top electrode via 118 may extend into a recess that is within the curved upper surface 116u of the top electrode 116 and that is defined by interior surfaces of the top electrode 116. In some embodiments, the top electrode 116 has a cross-sectional profile that is asymmetric about a line (not shown) bisecting the top electrode 116. In some embodiments (not shown), due to misalignment errors the bottommost surface 318 of the top electrode via 118 contacts the top electrode 116 and sidewall spacers 214 surrounding the top electrode 116. In some embodiments, the bottommost surface 318 of the top electrode via 118 may have an angled surface with a non-zero slope. In some embodiments, the angled surface is closer to the substrate 102 directly over the sidewall spacers 214 than directly over the top electrode 116.

Figure 4:
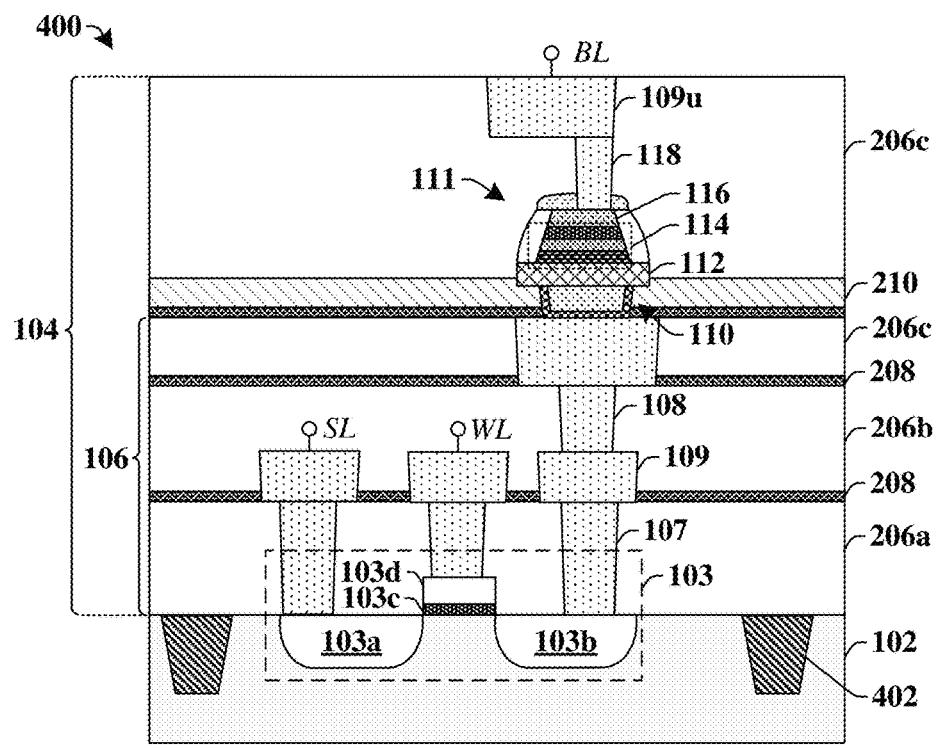

FIG. 4 illustrate some additional embodiments of an integrated chip 400 having an MRAM cell comprising a top electrode via with a smaller width than an underlying bottom electrode via.

The integrated chip 400 comprises a 1T1R MRAM cell architecture having an access device 103 connected to an MRAM device 111. The access device 103 is arranged within a substrate 102. In some embodiments, the access device 103 may comprise a MOSFET device having a gate electrode 103d that is arranged between a source region 103a and a drain region 103b and that is separated from the substrate 102 by a gate dielectric 103c. In other embodiments, the access device 103 may comprise a HEMT, a BJT, or the like. In some embodiments, one or more isolation structure 402 may be disposed within the substrate 102 along opposing sides of the access device 103. In some embodiments, the one or more isolation structures 402 may comprise shallow trench isolation (STI) structures.

A dielectric structure 104 is arranged over the substrate 102. One or more lower interconnect layers 106 including conductive contacts 107, interconnect vias 108, and interconnect wires 109, are surrounded by the dielectric structure 104. The interconnect wires 109 include a source-line SL comprising a first interconnect wire that is electrically coupled to the source region 103a. The interconnect wires 109 further comprise a word-line WL comprising a second interconnect wire that is electrically coupled to the gate electrode 103d.

An MRAM device 111 is arranged within the dielectric structure 104 and comprises a bottom electrode 112 separated from a top electrode 116 by an MTJ 114. The bottom electrode 112 is connected to the drain region 103b by the one or more lower interconnect layers 106. The top electrode 116 is further coupled to a bit-line BL by way of a top electrode via 118 and an upper interconnect wire 109u.

Although integrated chip 400 illustrates the word-line WL, the source-line SL, the bit-line BL, and the MRAM device 111 as being located at certain levels within a BEOL (back-end-of-the-line) stack, it will be appreciated that the positon of these elements is not limited to those illustrated positions. Rather, the elements may be at different locations within a BEOL stack. For example, in some alternative embodiments, the MRAM device 111 may be located between a second and third metal interconnect wire.

Figure 5:
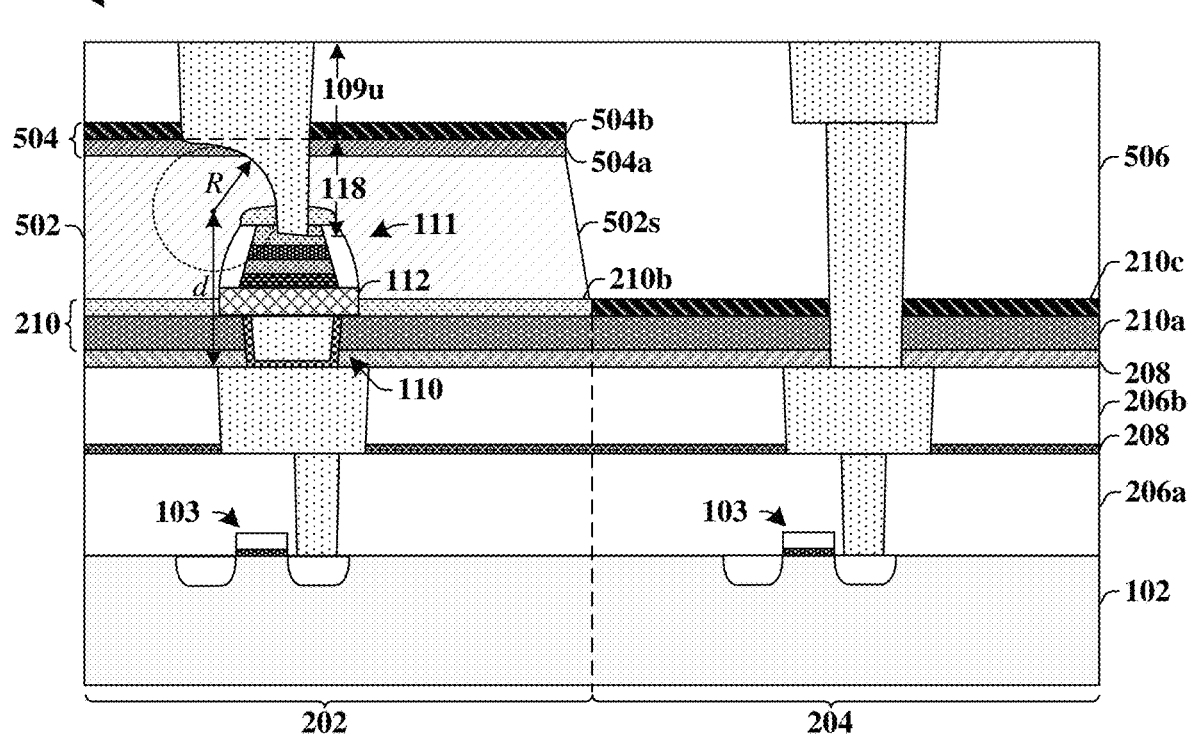

FIG. 5 illustrate some additional embodiments of an integrated chip 500 having an MRAM cell comprising a top electrode via with a smaller width than an underlying bottom electrode via.

The integrated chip 500 comprises a lower insulating structure 210 disposed over one or more lower ILD layers 206a-206b. In some embodiments, the lower insulating structure 210 is separated from the one or more lower ILD layers 206a-206b by an etch stop layer 208. In some embodiments, the lower insulating structure 210 comprises a first dielectric layer 210a, a second dielectric layer 210b over the first dielectric layer 210a, and a third dielectric layer 210c over the first dielectric layer 210a and laterally abutting the second dielectric layer 210b. In some embodiments, the first dielectric layer 210a extends to a top of a bottom electrode via 110. In such embodiments, a bottom electrode 112 of an MRAM device 111 may be on a top of the first dielectric layer 210a. In some embodiments, the second dielectric layer 210b is completely over the bottom electrode via 110 and laterally surrounds the bottom electrode 112.

In some embodiments, the first dielectric layer 210a may comprise silicon rich oxide or the like. In some embodiments, the first dielectric layer 210a may have a thickness that is in a range of between approximately 150 Angstroms and approximately 200 Angstroms. In some additional embodiments, the first dielectric layer 210a may have a thickness that is approximately equal to 180 Angstroms. In some embodiments, the first dielectric layer 210a may have a greater (i.e., larger) thickness in the logic region 204 than in the embedded memory region 202. In some embodiments, the second dielectric layer 210b may comprise silicon carbide, silicon nitride, or the like. In some embodiments, the second dielectric layer 210b may be a same material as a masking layer 216 over the MRAM device 111. In some embodiments, the third dielectric layer 210c may comprise Tetraethyl orthosilicate (TEOS) or the like.

Within the embedded memory region 202, a first upper ILD layer 502 is disposed over the lower insulating structure 210. The first upper ILD layer 502 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. A masking structure 504 is disposed over the first upper ILD layer 502. In some embodiments, the masking structure 504 comprises a first masking layer 504a over the first upper ILD layer 502 and a second masking layer 504b over the first masking layer 504a. In some embodiments, the first masking layer 504a may comprise silicon carbide, silicon nitride, or the like. In some embodiments, the second masking layer 504b may comprise a same material as the third dielectric layer 210c. For example, in some embodiments, the second masking layer 504b may comprise TEOS or the like.

A second upper ILD layer 506 is disposed over the masking structure 504. The second upper ILD layer 506 laterally contacts the first upper ILD layer 502 along an angled sidewall 502s of the first upper ILD layer 502. The second upper ILD layer 506 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. In some embodiments, the second upper ILD layer 506 comprises a different material than the first upper ILD layer 502.

An MRAM device 111 is surrounded by the first upper ILD layer 502. A top electrode via 118 contacts a top of the MRAM device 111. The top electrode via 118 extends through the second upper ILD layer 506 and a part of the masking structure 504. In some embodiments, the top electrode via 118 may have a top that is substantially aligned with a top of the first masking layer 504a. In some embodiments, the top electrode via 118 has a curved sidewall that has a first curvature defined by a first radius R centered at a point that is a distance d above a bottom of a bottom electrode via 110 underlying the MRAM device 111.

Figure 6:
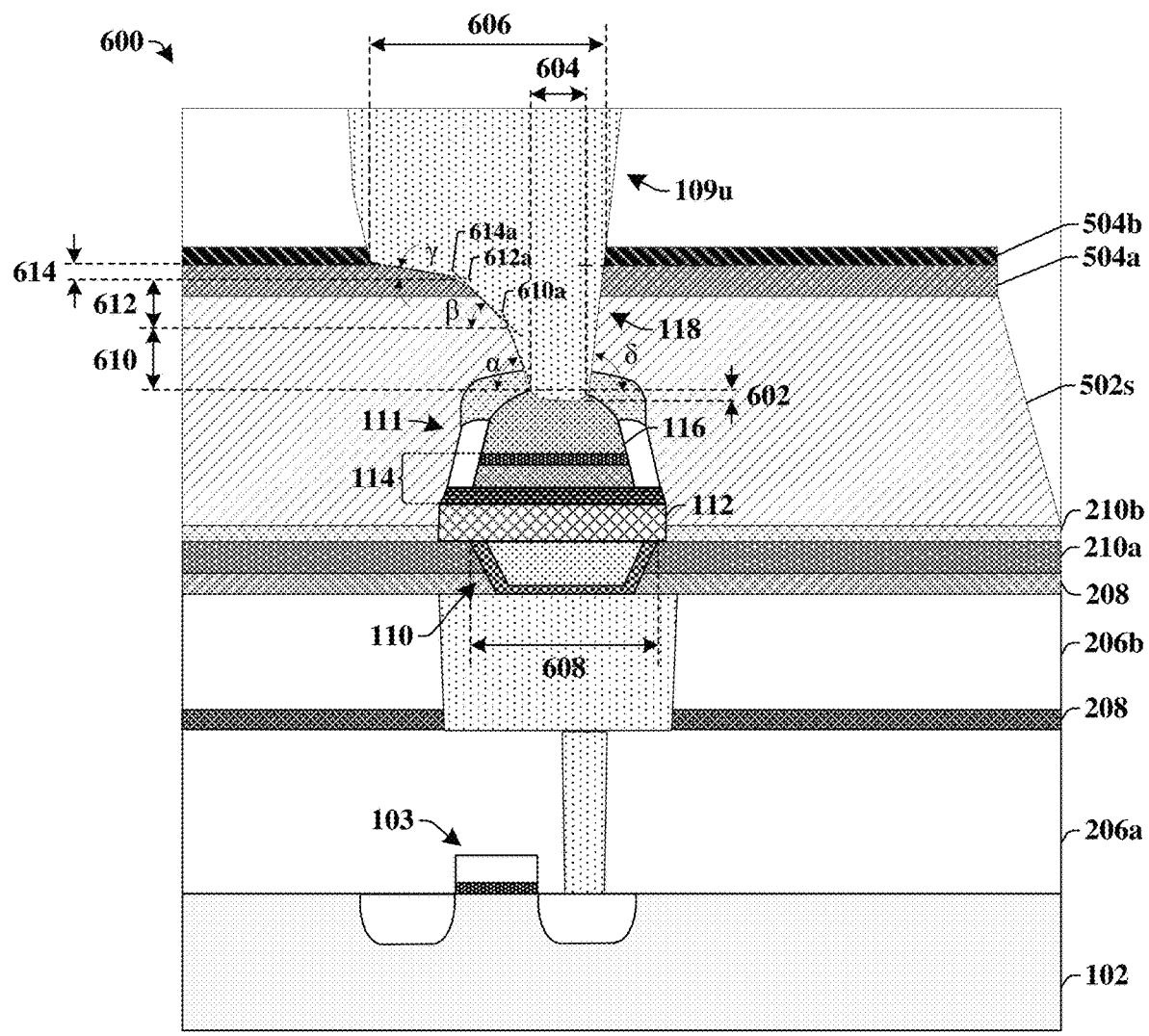

FIG. 6 illustrates a cross-sectional view of some additional embodiments of an integrated chip 600 having an MRAM device with a top electrode via having a smaller width than an underlying bottom electrode via.

The integrated chip 600 comprises an MRAM device 111 disposed over a bottom electrode via 110 over a substrate 102. The MRAM device 111 comprises a bottom electrode 112 separated from a top electrode 116 by an MTJ 114. A top electrode via 118 contacts the top electrode 116. In some embodiments, the top electrode via 118 may extend to a non-zero distance 602 below a top surface of the top electrode 116. In some embodiments, the non-zero distance 602 may be in a range of between approximately 10 Angstroms and approximately 50 Angstroms. In some embodiments, the top electrode via 118 may have a bottommost surface with a bottom width 604 in a range of between approximately 10 nanometers and approximately 30 nanometers. In some embodiments, a top of the top electrode via 118 may have a top width 606 in a range of between approximately 70 nanometers and approximately 120 nanometers. In some embodiments, a top of the bottom electrode via 110 may have a top surface with a width 608 in a range of between approximately 60 nanometers and approximately 110 nanometers.

In some embodiments, the top electrode via 118 may comprise a lower segment 610, a middle segment 612 over the lower segment 610, and an upper segment 614 over the middle segment 612. A first line 610a is tangent to a first sidewall of the lower segment 610 of the top electrode via 118. In some embodiments, the first line 610a may be arranged at a first angle α with respect to a horizontal plane that is parallel to an upper surface of the substrate 102. In some embodiments, the first angle α may be approximately equal to 72°.

In some embodiments, a second line 612a is tangent to a second sidewall of the middle segment 612 of the top electrode via 118. In some embodiments, the second line 612a may be arranged at a second angle β with respect to a horizontal plane that is parallel to the upper surface of the substrate 102. In some embodiments, the second angle β may be smaller than the first angle α. In some embodiments, the second angle β may be approximately equal to 43°.

In some embodiments, a third line 614a is tangent to a third sidewall of the upper segment 614 of the top electrode via 118. In some embodiments, the third line 614a may be arranged at a third angle γ with respect to a horizontal plane that is parallel to the upper surface of the substrate 102. In some embodiments, the third angle γ may be smaller than the second angle β. In some embodiments, the third angle γ may be approximately equal to 13°.

In some embodiments, a fourth sidewall of the top electrode via 118 opposes the first sidewall, the second sidewall, and the third sidewall. In some embodiments, the fourth sidewall may be arranged at a fourth angle δ with respect to a horizontal plane that is parallel to the upper surface of the substrate 102. In some embodiments, the fourth angle δ may be larger than the first angle α. In some embodiments, the fourth angle δ may be approximately equal to 83°.

FIGS. 7-25 illustrate cross-sectional views 700-2500 of some embodiments of a method of forming an integrated chip having an MRAM cell comprising a top electrode via with a smaller width than an underlying bottom electrode via. Although FIGS. 7-25 are described in relation to a method, it will be appreciated that the structures disclosed in FIGS. 7-25 are not limited to such a method, but instead may stand alone as structures independent of the method.

Figure 7:
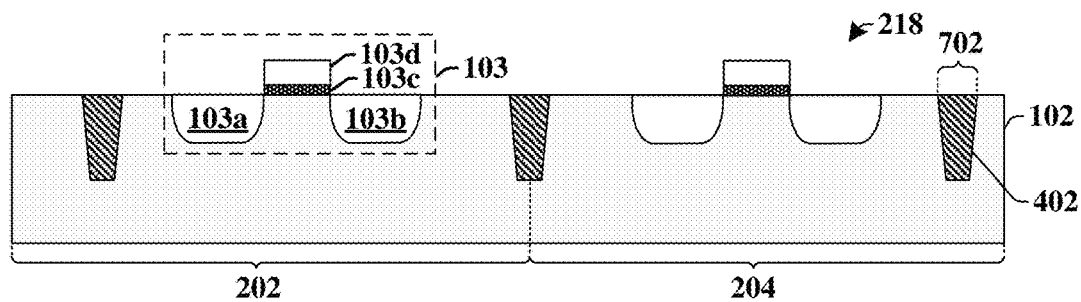
FIGS. 7-26 illustrate cross-sectional views of some embodiments of a method of forming an integrated chip having an MRAM cell comprising a top electrode via with a smaller width than an underlying bottom electrode via.

As shown in cross-sectional view 700 of FIG. 7, an access device 103 is formed within a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the access device 103 may comprise a transistor formed by depositing a gate dielectric film and a gate electrode film over the substrate 102. The gate dielectric film and the gate electrode film are subsequently patterned to form a gate dielectric 103c and a gate electrode 103d. The substrate 102 may be subsequently implanted to form a source region 103a and a drain region 103b within the substrate 102 on opposing sides of the gate electrode 103d.

In some embodiments, one or more isolation structures 402 may be formed within the substrate 102 on opposing sides of the access device 103. In some embodiments, the one or more isolation structures 402 may be formed by selectively etching the substrate 102 to form one or more shallow trenches 702 and subsequently forming one or more dielectric materials within the one or more shallow trenches 702. In some embodiments, the etching process may comprise a dry etching process. For example, the etching process may comprise a plasma etching process, such as an inductively coupled plasma (ICP) etching process, a capacitively coupled plasma (CCP) etching process, or the like. In other embodiments, the etching process may comprise a wet etching process.

Figure 8:
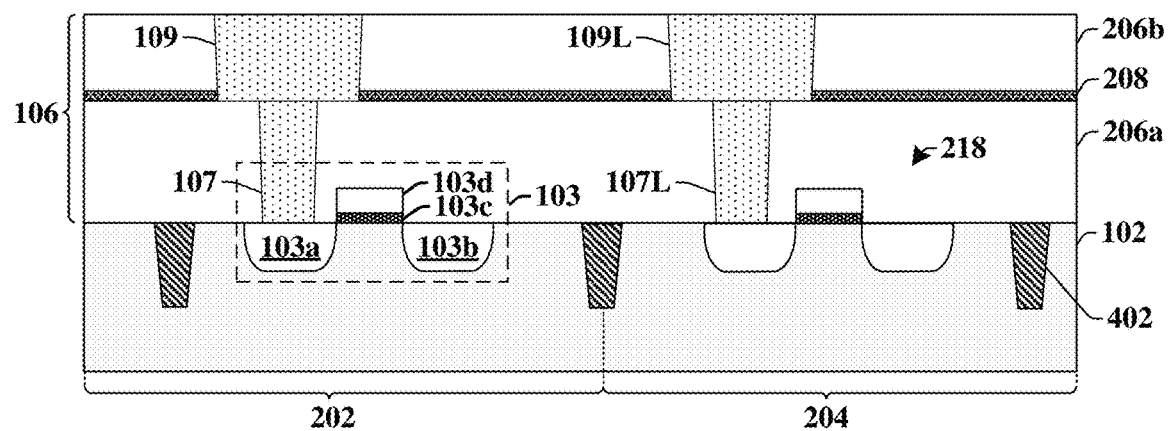

As shown in cross-sectional view 800 of FIG. 8, one or more lower interconnect layers 106 are formed within one or more lower inter-level dielectric (ILD) layers 206a-206b over the substrate 102. The one or more lower interconnect layers 106 may be formed by forming one of the one or more lower ILD layers 206a-206b over the substrate 102, selectively etching the ILD layer (e.g., an oxide, a low-k dielectric, or an ultra low-k dielectric) to define a via hole and/or a trench within the ILD layer, forming a conductive material (e.g., copper, aluminum, etc.) within the via hole and/or a trench to fill the opening, and performing a planarization process (e.g., a chemical mechanical planarization process).

Figure 9:
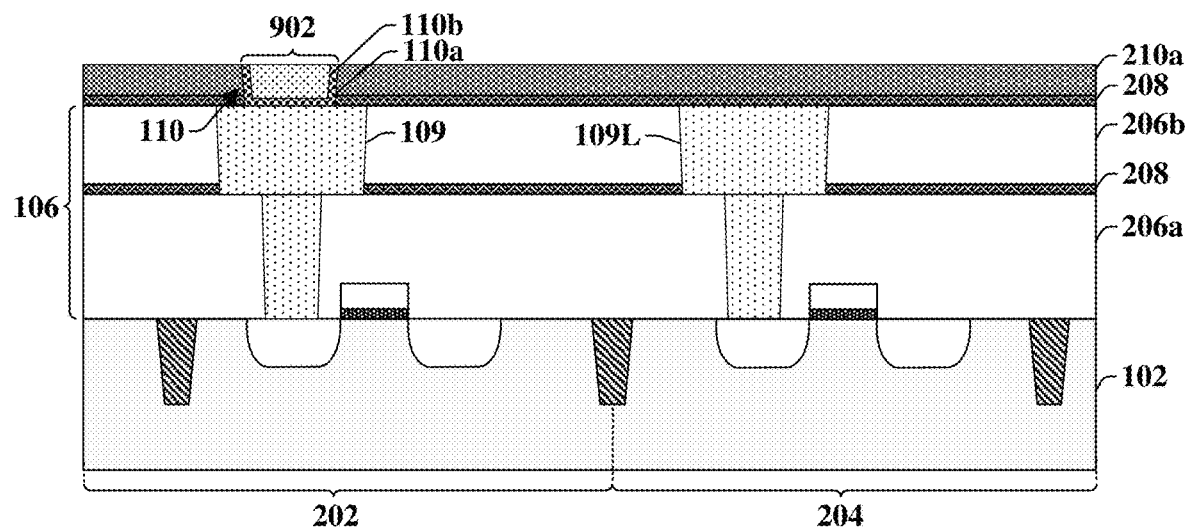

As shown in cross-sectional view 900 of FIG. 9, a first dielectric layer 210a is formed onto the one or more lower interconnect layers 106 and the one or more lower ILD layers 206a-206b. In some embodiments, the first dielectric layer 210a may comprise one or more of silicon-nitride, silicon-carbide, or the like. In some embodiments, the first dielectric layer 210a may be formed by a plurality of different deposition processes (e.g., physical vapor deposition (PVD), chemical vapor deposition (CVD), PE-CVD, atomic layer deposition (ALD), sputtering, etc.) to a thickness in a range of between approximately 200 angstroms and approximately 300 angstroms. After deposition, the first dielectric layer 210a is selectively patterned to define an opening 902 extending through the first dielectric layer 210a to the one or more lower interconnect layers 106.

In some embodiments, a bottom electrode via 110 is formed within the opening 902. In some embodiments, the bottom electrode via 110 may be formed by forming liner 110a within the opening 902. In various embodiments, the liner 110a may comprise a glue layer configured to increase adhesion between adjacent layers and/or a diffusion barrier layer configured to prevent diffusion between adjacent layers. A conductive material 110b is formed over the liner 110a within the opening 902. In some embodiments, the liner 110a and the conductive material 110b may be formed by deposition processes. A planarization process (e.g., a chemical mechanical planarization process) may subsequently be performed. In some embodiments, the liner 110a may comprise tantalum nitride, titanium nitride, or the like. In some embodiments, the conductive material 110b may comprise tantalum, titanium, or the like.

Figure 10:
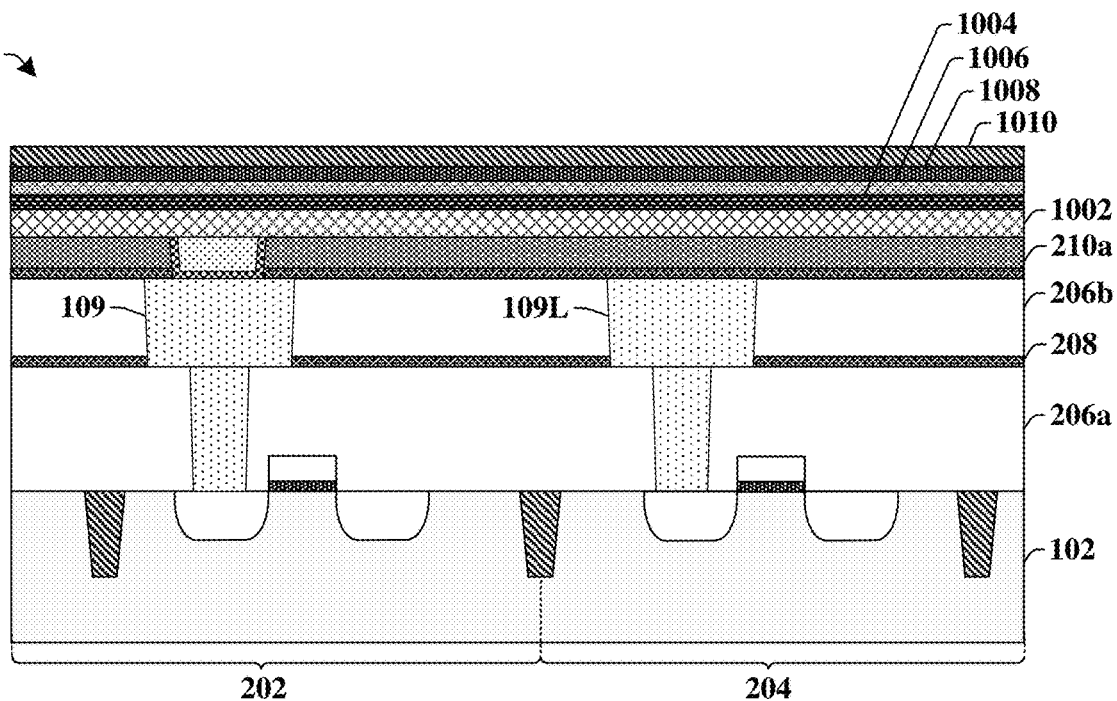

As shown in cross-sectional view 1000 of FIG. 10, a bottom electrode layer 1002 is formed on the first dielectric layer 210a and the conductive material 110b. A lower ferromagnetic electrode 1004, a tunneling barrier layer 1006, an upper ferromagnetic electrode 1008, and a top electrode layer 1010 are subsequently formed over the bottom electrode layer 1002.

Figure 11:
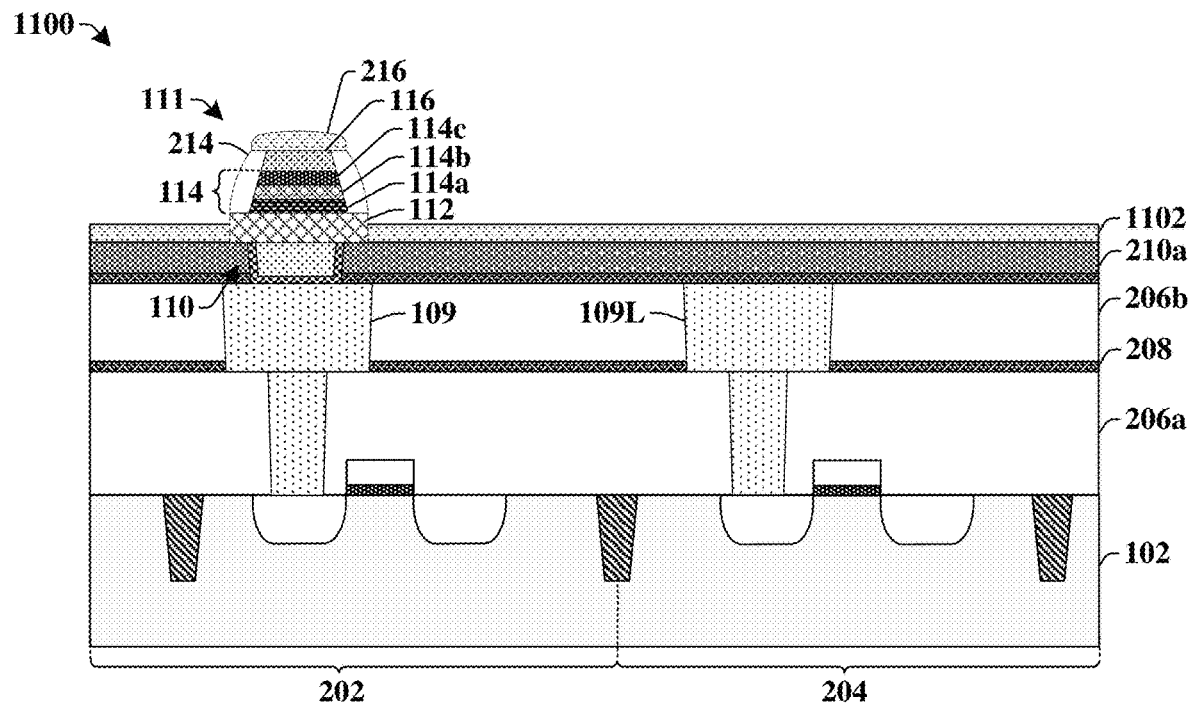

As shown in cross-sectional view 1100 of FIG. 11, one or more patterning processes are performed to define an MRAM device 111. In some embodiments, a first patterning process comprises a first etching process of the lower ferromagnetic electrode (1004 of FIG. 10), the tunneling barrier layer (1006 of FIG. 10), the upper ferromagnetic electrode (1008 of FIG. 10), and the top electrode layer (1010 of FIG. 10). The first etching process defines a lower ferromagnetic layer 114a, an upper ferromagnetic layer 114c, a tunneling barrier layer 114b, and a top electrode 116.

After the first patterning process, sidewall spacers 214 may be formed along opposing sides of the top electrode 116. In some embodiments, the sidewall spacers 214 may be formed by depositing a spacer layer over the substrate 102 using a deposition technique (e.g., PVD, CVD, PE-CVD, ALD, sputtering, etc.). The spacer layer is subsequently etched to remove the spacer layer from horizontal surfaces, leaving the spacer layer along opposing sides of the top electrode 118 as the sidewall spacers 214. In various embodiments, the spacer layer may comprise silicon nitride, a silicon dioxide ($SiO_2$), silicon oxy-nitride (e.g., SiON), or the like. In various embodiments, the spacer layer may be formed to a thickness in a range of between approximately 400 Angstroms and approximately 600 Angstroms. A second etching process is subsequently performed to remove parts of the bottom electrode layer 1002 and to define a bottom electrode 112.

After the second etching process, a masking layer 216 may be formed over the MRAM device 111 and a second dielectric 1102 may be formed over the first dielectric layer 210a. In some embodiments, the masking layer 216 and the second dielectric 1102 may comprise a same material and/or be concurrently formed. For example, the masking layer 216 and the second dielectric 1102 may comprise silicon carbide, silicon nitride, or the like. In some embodiments (not shown), the material of the masking layer 216 may be formed along sidewalls of the sidewall spacers 214. In such embodiments, a thickness of the material along the sidewalls of the sidewall spacers 214 is much less than (e.g., 1 to 4 orders of magnitude) that of the masking layer 216 or the second dielectric 1102.

Figure 12:
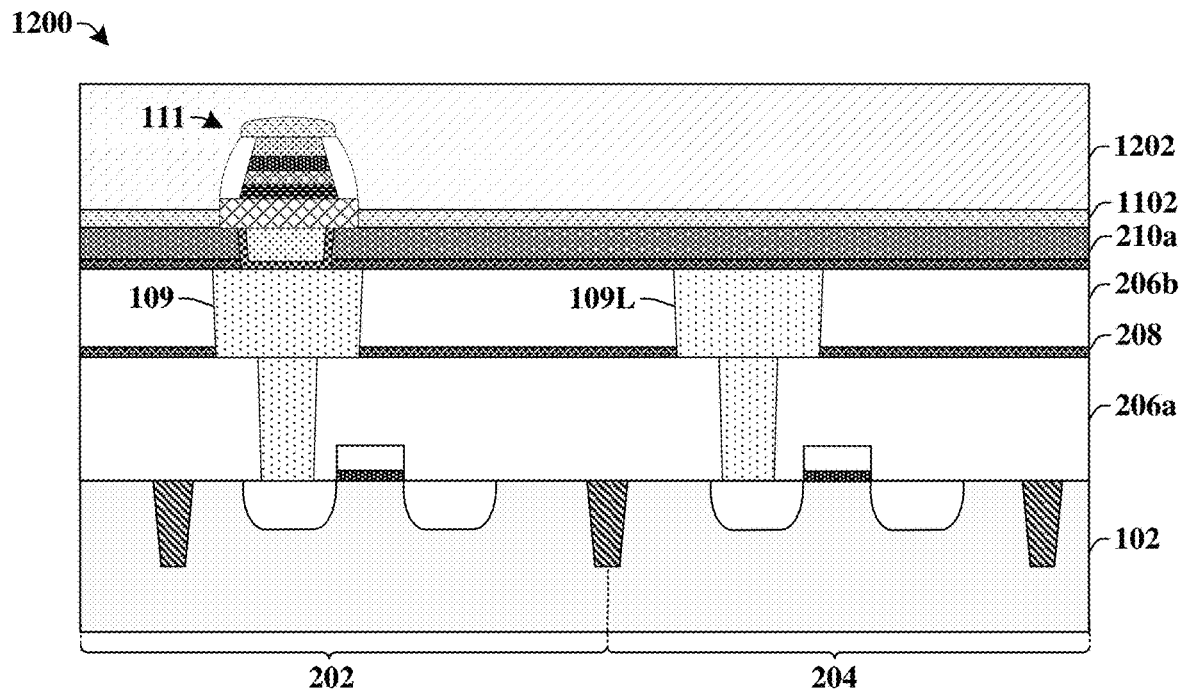

As shown in cross-sectional view 1200 of FIG. 12, a first upper ILD layer 1202 is formed over the second dielectric 1102. The first upper ILD layer 1202 is formed to cover the MRAM device 111. In some embodiments, the first upper ILD layer 1202 may be deposited by a deposition process (e.g., PVD, CVD, PE-CVD, ALD, or the like). In various embodiments, the first upper ILD layer 1202 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. In some embodiments, the first upper ILD layer 1202 may be formed to a thickness of between approximately 50 nm and approximately 175 nm.

Figure 13:
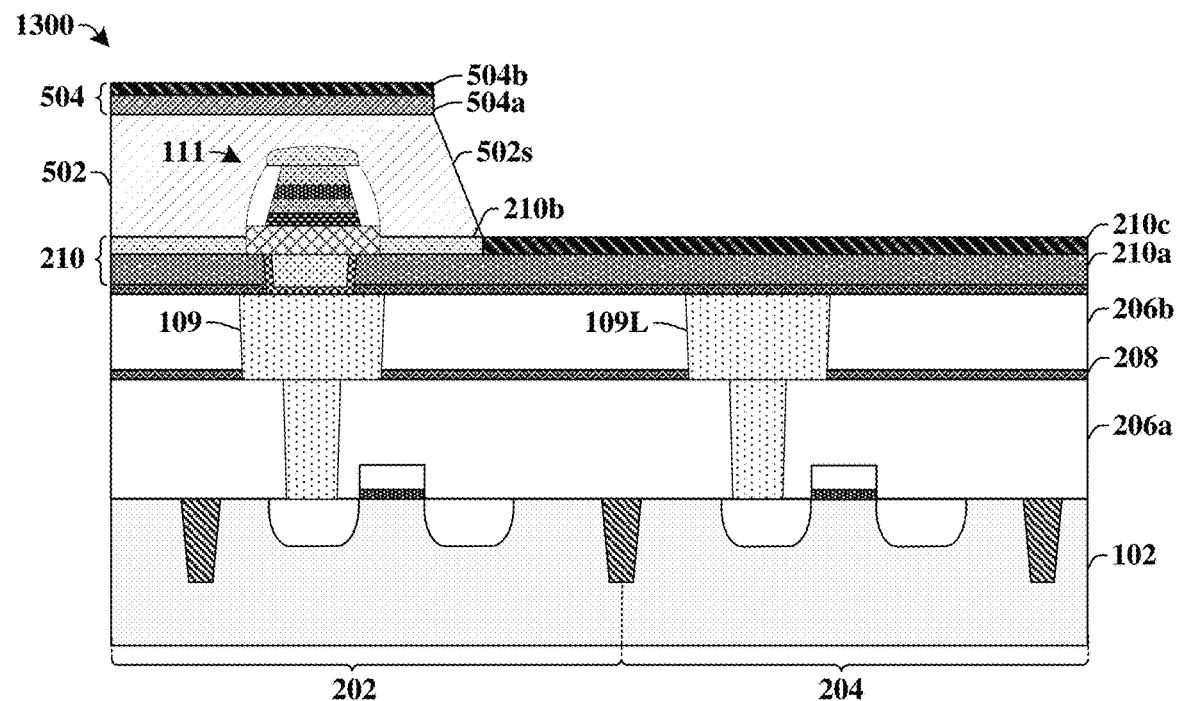

As shown in cross-sectional view 1300 of FIG. 13, a first masking layer 504a is formed over the first upper ILD layer (1202 of FIG. 12) within the embedded memory region 202. The first upper ILD layer (1202 of FIG. 12) is subsequently etched according to the first masking layer 504a to remove the first upper ILD layer (1202 of FIG. 12) from within the logic region 204. The etching process causes the first upper ILD layer 502 to have an angled sidewall 502s facing the logic region 204. In some embodiments, the first masking layer 504a may be deposited by way of one or more deposition processes followed by a photolithographic patterning process. In various embodiments, the first masking layer 504a may comprise one or more of silicon carbide, silicon nitride, or the like. In some embodiments, the layer of silicon carbide may have a thickness in a range of between approximately 100 Angstroms and approximately 200 Angstroms. In some additional embodiments, the layer of silicon carbide may have a thickness that is approximately equal to 150 Angstroms.

A second masking layer 504b and a third dielectric layer 210c are formed over the substrate 102 after the etching process is completed. The second masking layer 504b may be formed on the first masking layer 504a and the third dielectric layer 210c may be formed onto the first dielectric layer 210a. In some embodiments, the second masking layer 504b and the third dielectric layer 210c may be a same material and/or be concurrently formed. For example, the second masking layer 504b and the third dielectric layer 210c may comprise TEOS or the like. In some embodiments (not shown), a material of the second masking layer 504b may be formed along the angled sidewall 502s. In such embodiments, a thickness of the material along the angled sidewall 502s is much less than (e.g., 1 to 3 orders of magnitude) that of the second masking layer 504b and the third dielectric layer 210c due to the anisotropy of a process used to form the material.

Figure 14:
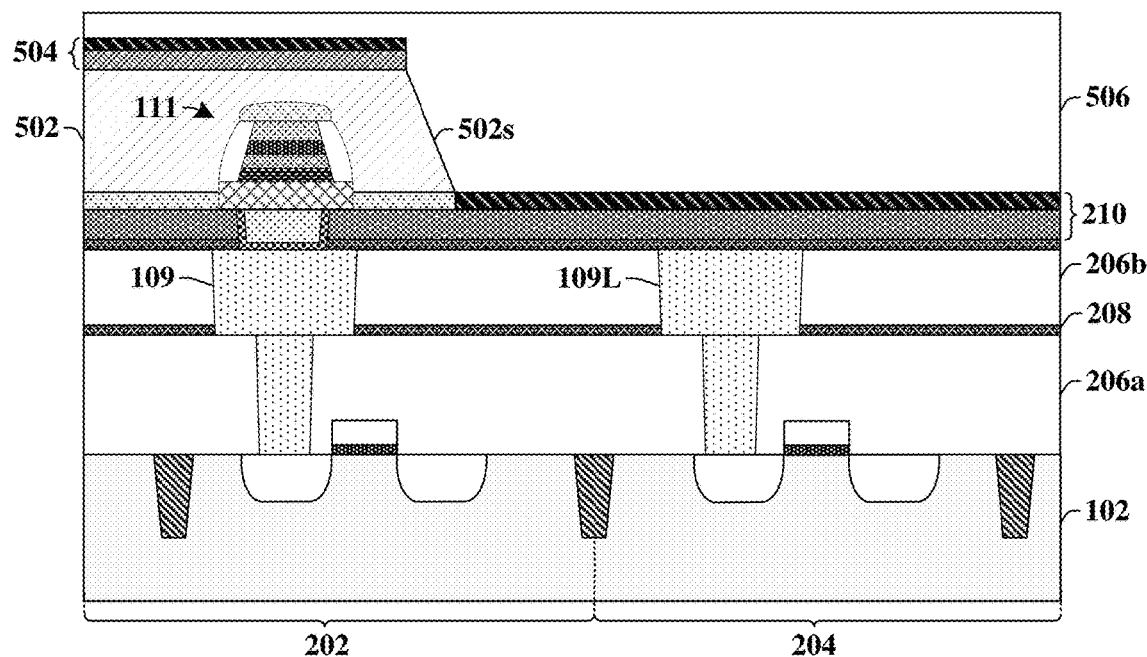

As shown in cross-sectional view 1400 of FIG. 14, a second upper ILD layer 506 is formed over the lower insulating structure 210. The second upper ILD layer 506 covers the first upper ILD layer 502. In some embodiments, the second upper ILD layer 506 may be deposited by a deposition process. In various embodiments, the second upper ILD layer 506 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. In some embodiments, the second upper ILD layer 506 may be formed to a thickness of between approximately 100 nm and approximately 200 nm. In some embodiments, the second upper ILD layer 506 may be formed to a thickness of approximately 160 nm.

Figure 15:
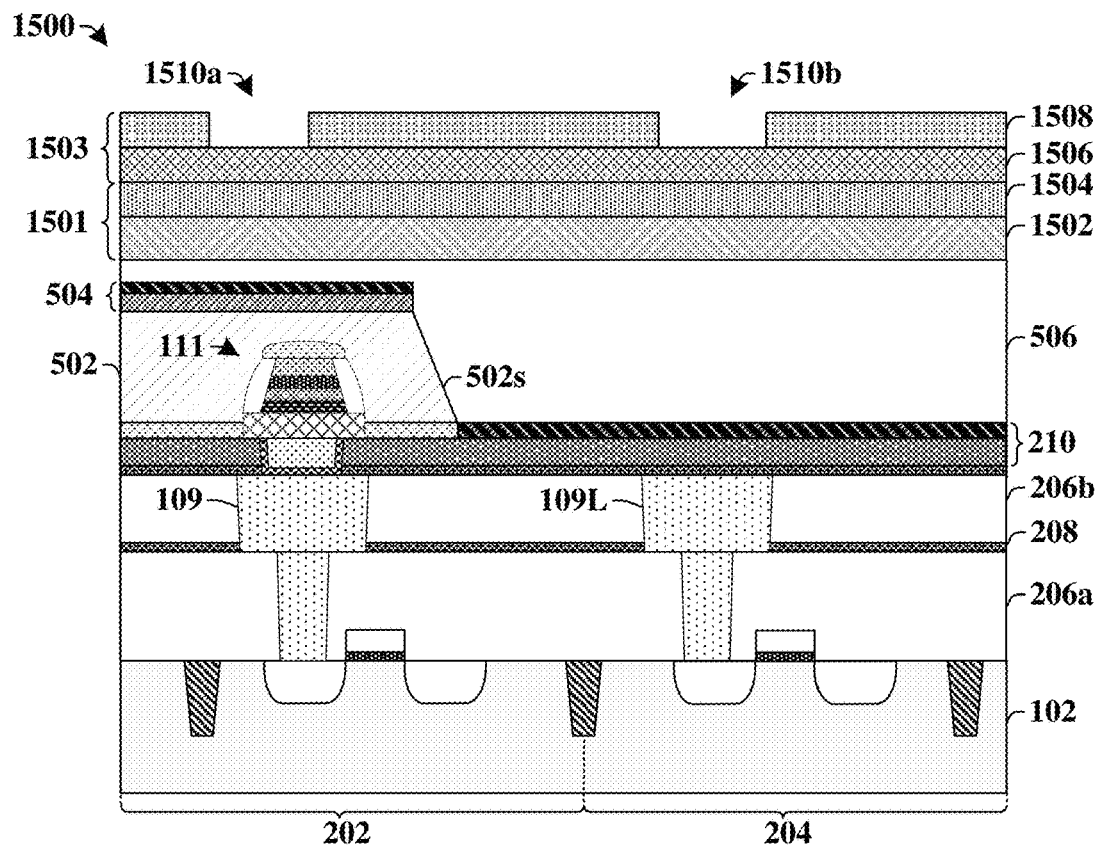

As shown in cross-sectional view 1500 of FIG. 15, a hard mask structure 1501 is formed over the second upper ILD layer 506. In some embodiments, the hard mask structure 1501 may comprise a multilayer hard mask structure. In some embodiments, the hard mask structure 1501 comprises a lower hard mask layer 1502 and an upper hard mask layer 1504. In some embodiments, the lower hard mask layer 1502 may comprise a dielectric hard mask layer and/or an antireflective coating. For example, in some embodiments, the lower hard mask layer 1502 may comprise a dielectric hard mask layer (e.g., an oxide) and a nitrogen free antireflective layer (NFARL) over the dielectric hard mask layer. In some such embodiments, the dielectric hard mask layer may comprise a dielectric material having a thickness in a range of between approximately 50 Angstroms and approximately 150 Angstroms and the NFARL may have a thickness in a range of between approximately 150 Angstroms and approximately 250 Angstroms. In some additional embodiments, the dielectric hard mask layer may have a thickness that is approximately equal to 100 Angstroms and the NFARL may have a thickness of approximately 200 Angstroms. The upper hard mask layer 1504 may comprise a metal, such as titanium, tantalum, or the like. In some such embodiments, the upper hard mask layer 1504 may have a thickness in a range of between approximately 250 Angstroms and approximately 500 Angstroms. In some additional embodiments, the upper hard mask layer 1504 may have a thickness that is approximately equal to 350 Angstroms.

A first patterning structure 1503 is formed over the hard mask structure 1501. The first patterning structure 1503 has sidewalls that define a first opening 1510a within the embedded memory region 202 and a second opening 1510b within the logic region 204. In some embodiments, the first patterning structure 1503 comprises a tri-layer photoresist. In some such embodiments, the first patterning structure 1503 may comprise one or more planarizing layers 1506 and an overlying photoresist layer 1508. In some embodiments, the one or more planarizing layers 1506 comprise one or more of a silicon containing hard-mask, an oxide, an organic material, a spin on carbon (SOC), or the like.

Figure 16:
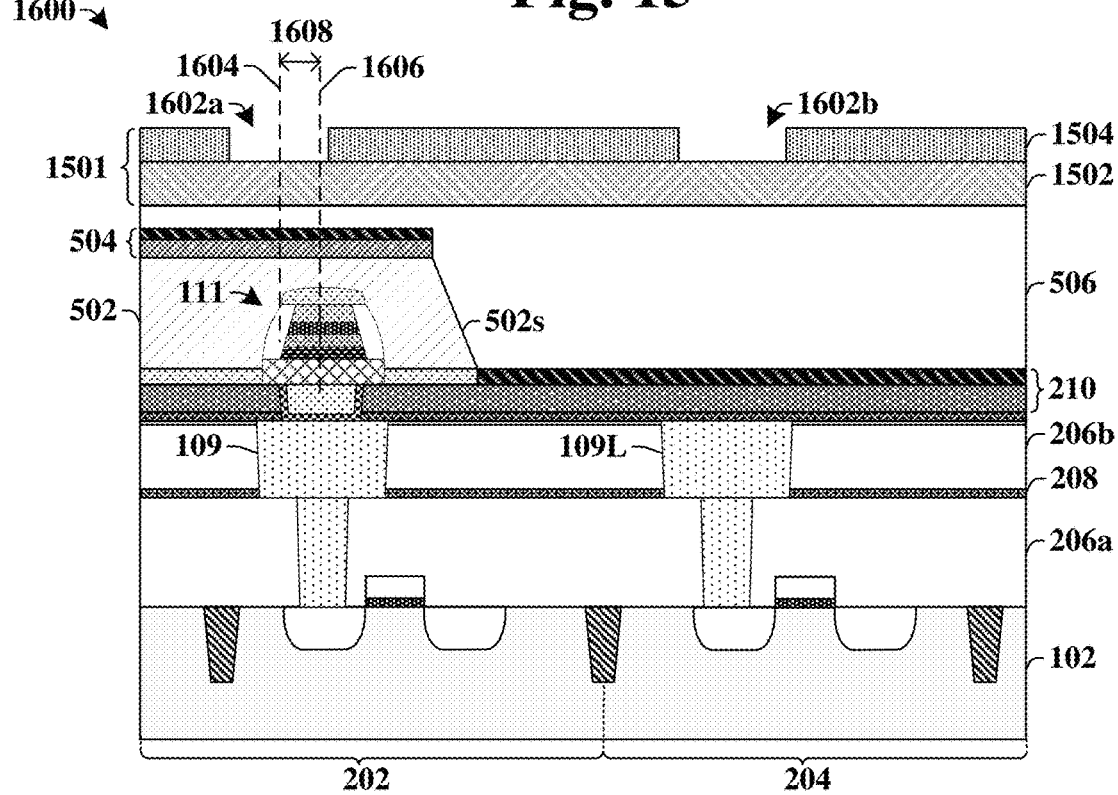

As shown in cross-sectional view 1600 of FIG. 16, the hard mask structure 1501 is patterned according to the first opening 1510a and the second opening 1510b to respectively define a third opening 1602a within the embedded memory region 202 and a fourth opening 1602b within the logic region 204. The third opening 1602a is centered along a vertically extending first line 1604 that is offset from a vertically extending second line 1606 that is centered on the MRAM device 111. In some embodiments, the first line 1604 is offset from the second line 1606 by a first non-zero distance 1608. In some embodiments, the first non-zero distance 1608 may be in a range of between approximately 30 nm and approximately 55 nm. In some embodiments, the first non-zero distance 1608 may be approximately equal to 45 nm.

Figure 17A:
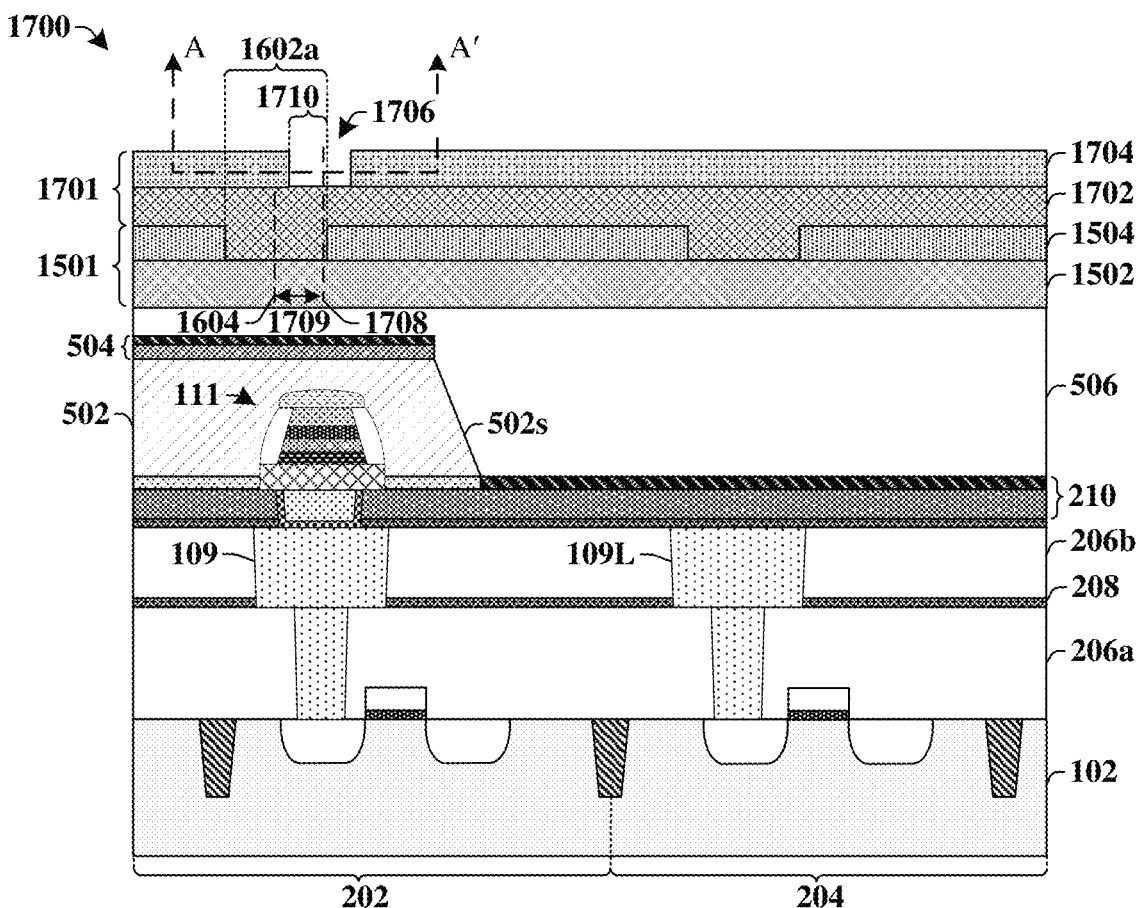

As shown in cross-sectional view 1700 of FIG. 17A, a second patterning structure 1701 is formed over the hard mask structure 1501. The second patterning structure 1701 has sidewalls that define a fifth opening 1706 over the third opening 1602a. The fifth opening 1706 is defined by a first sidewall of the second patterning structure 1701 that is directly over the third opening 1602a and a second sidewall of the second patterning structure 1701 that is outside of the third opening 1602a. In some embodiments, the second sidewall is directly over the upper hard mask layer 1504. In such embodiments, the fifth opening 1706 continuously extends in opposing directions past a sidewall of the upper hard mask layer 1504 that defines the third opening 1602a, while the third opening 1602a continuously extends past a sidewall of the second patterning structure 1701 that defines the fifth opening 1706. In some embodiments, the fifth opening 1706 is centered along a vertically extending second line 1708 that is offset from the first line 1604 by a second non-zero distance 1709. In some embodiments, the second line 1708 is substantially aligned (e.g., within a CD tolerance of less than approximately 5 nm) with a vertical line bisecting the MRAM device 111.

In some embodiments, the fifth opening 1706 may have a width that is in a range of between approximately 60 nm and approximately 80 nm. An intersection of the third opening 1602a and the fifth opening 1706 define a top electrode via region 1710 (i.e., a region in which the top electrode via will be subsequently formed) having a smaller width than the fifth opening 1706. In some embodiments, the top electrode via region 1710 may have a width that is between approximately ¼ and approximately ½ of the width of the fifth opening 1706.

In some embodiments, the second patterning structure 1701 comprises a tri-layer photoresist. In some such embodiments, the second patterning structure 1701 may comprise one or more planarizing layers 1702 and a photoresist layer 1704. In some embodiments, the one or more planarizing layers 1702 comprise one or more of a silicon containing hard-mask, an oxide, an organic material, a spin on carbon (SOC), or the like. In such embodiments, the width of the fifth opening 1706 is an after development inspection (ADI) width (a width of the opening within the photoresist layer 1704 occurring after development of the photoresist layer 1704).

Figure 17B:
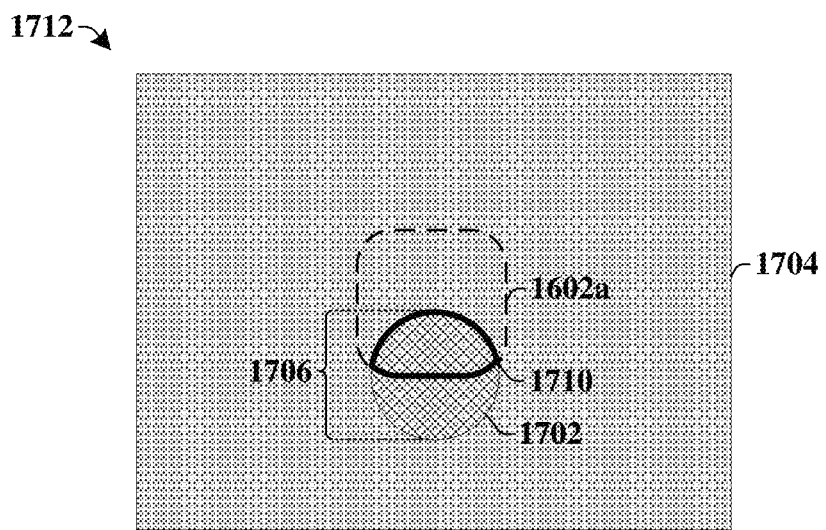

FIG. 17B illustrates a top-view 1712 of the cross-sectional view 1700 of FIG. 17A (taken along line A-A'). As shown in top-view 1712, an intersection of the third opening 1602a and the fifth opening 1706 define the top electrode via region 1710, which has a smaller area than the fifth opening 1706.

Figure 18A:
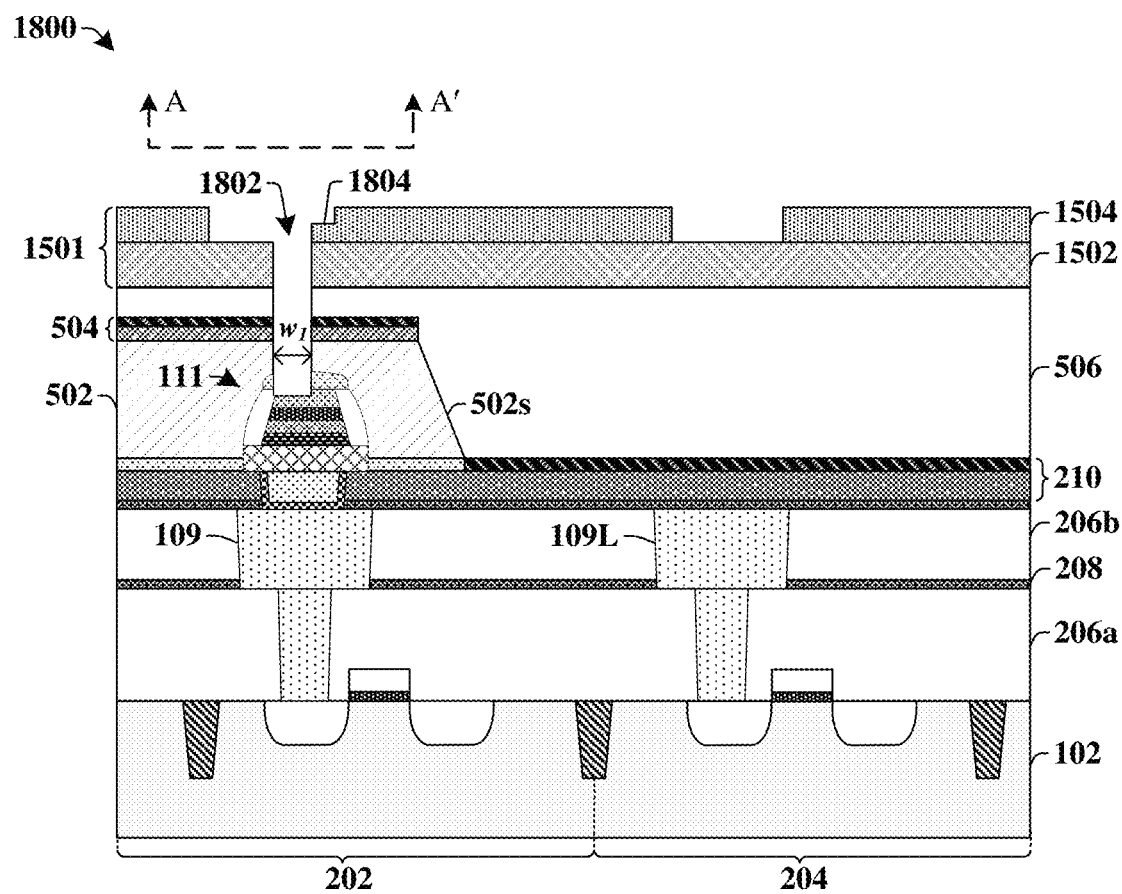
Figure 18B:
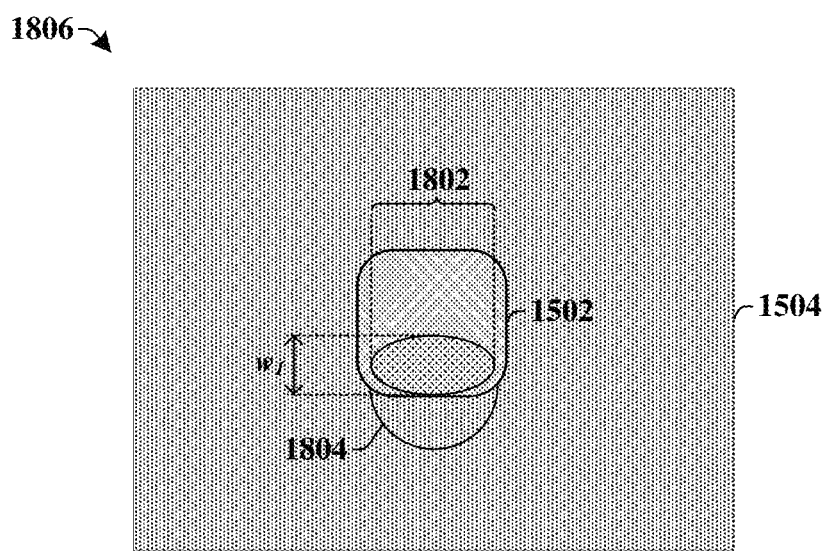

As shown in cross-sectional view 1800 of FIG. 18A, a first etching process is performed according the second patterning structure (1701 of FIG. 17A) to define a top electrode via hole 1802. The top electrode via hole 1802 extends through the second upper ILD layer 506 to the MRAM device 111. The hard mask structure 1501 limits an area of the second upper ILD layer 506 that the first etch process etches, so as to provide for a top electrode via hole 1802 that has a bottom with a first width $w_1$ (e.g., an after etch inspection (AEI) width) that is smaller than a width of the fifth opening (1706 of FIG. 17). The first width $w_1$ of the bottom of the top electrode via hole 1802 makes it easier to form the via directly over the MRAM device 111 and also reduces over-etching (since the smaller size of the top electrode via hole 1802 allows less etchant into the hole and thus reduces over-etching). In some embodiments, the first width $w_1$ is in a range of between approximately 10 nm and approximately 30 nm. In some embodiments, the first width $w_1$ may be approximately equal to 25 nm. FIG. 18B illustrates a top-view 1806 (taken along line A-A') of the cross-sectional view 1800 of FIG. 18A.

In some embodiments, the etching process will extend to different depths in different regions. For example, in regions directly below both the third opening (1602a of FIG. 17A) and the fifth opening (1706 of FIG. 17A), the etching process forms the top electrode via hole 1802 that extends to the MRAM device 111. In regions directly below the third opening (1602a of FIG. 17A) and not below the fifth opening (1706 of FIG. 17A), the etching process exposes an upper surface of the lower hard mask layer 1502. In regions directly below the fifth opening (1706 of FIG. 17A) and not below the third opening (1602a of FIG. 17A), etching process removes a part of the upper hard mask layer 1504 to form an upper surface 1804 of the upper hard mask layer 1504 that is below a top of the upper hard mask layer 1504.

Figure 19A:
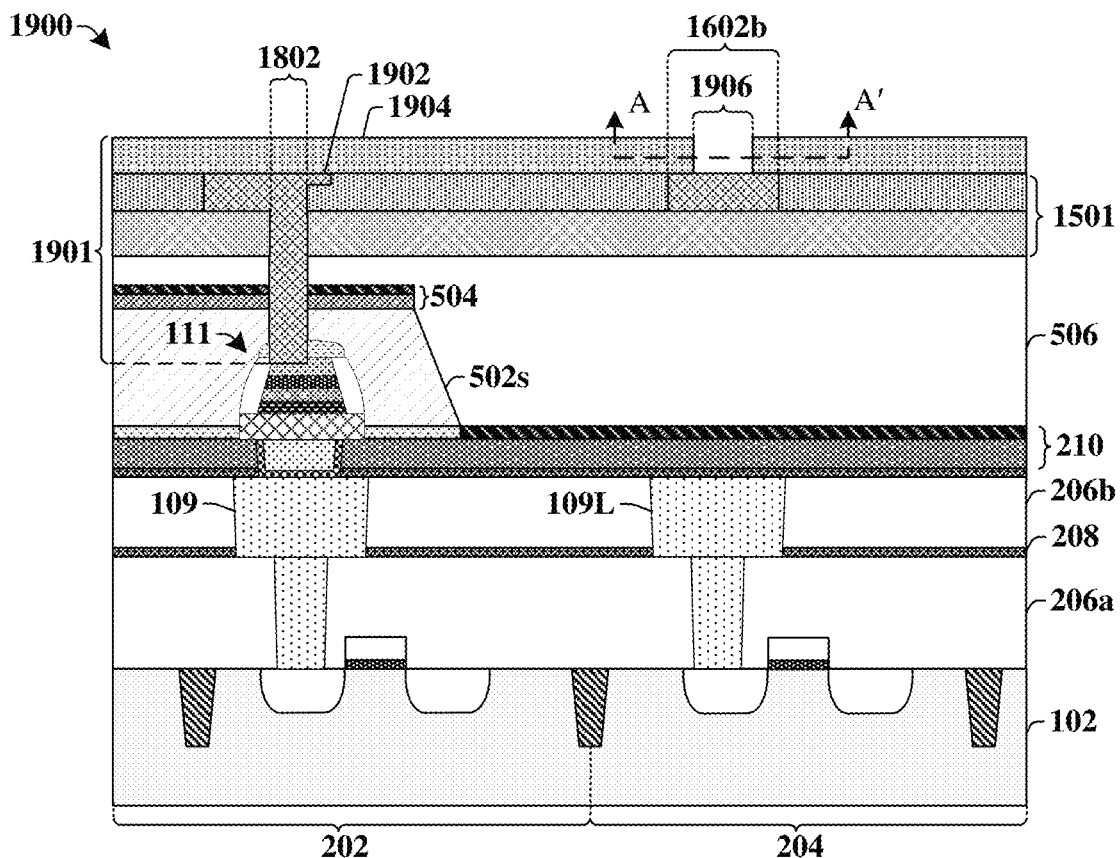
Figure 19B:
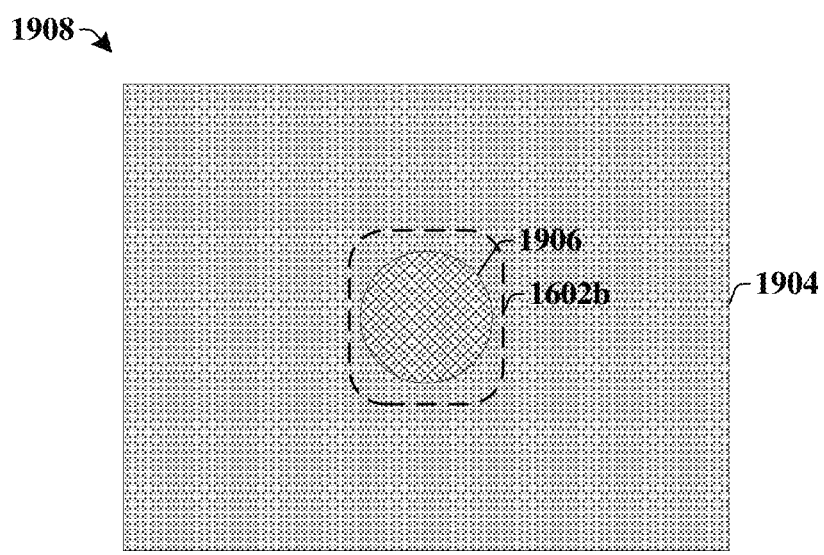

As shown in cross-sectional view 1900 of FIG. 19A, a third patterning structure 1901 is formed over the hard mask structure 1501. In some embodiments, the third patterning structure 1901 may comprise a tri-layer photoresist having one or more planarizing layers 1902 and a photoresist layer 1904 over the one or more planarizing layers 1902. The third patterning structure 1901 comprises sidewalls defining a sixth opening 1906 directly over the fourth opening 1602b within the hard mask structure 1501. The sidewalls of the third patterning structure 1901 are directly over the fourth opening 1602b. In some embodiments, the sixth opening 1906 may have a width that is approximately equal to a width of the fifth opening (1706 of FIG. 17A). FIG. 19B illustrates a top-view 1908 of the cross-sectional view 1900 of FIG. 19A (taken along line A-A').

Figure 20:
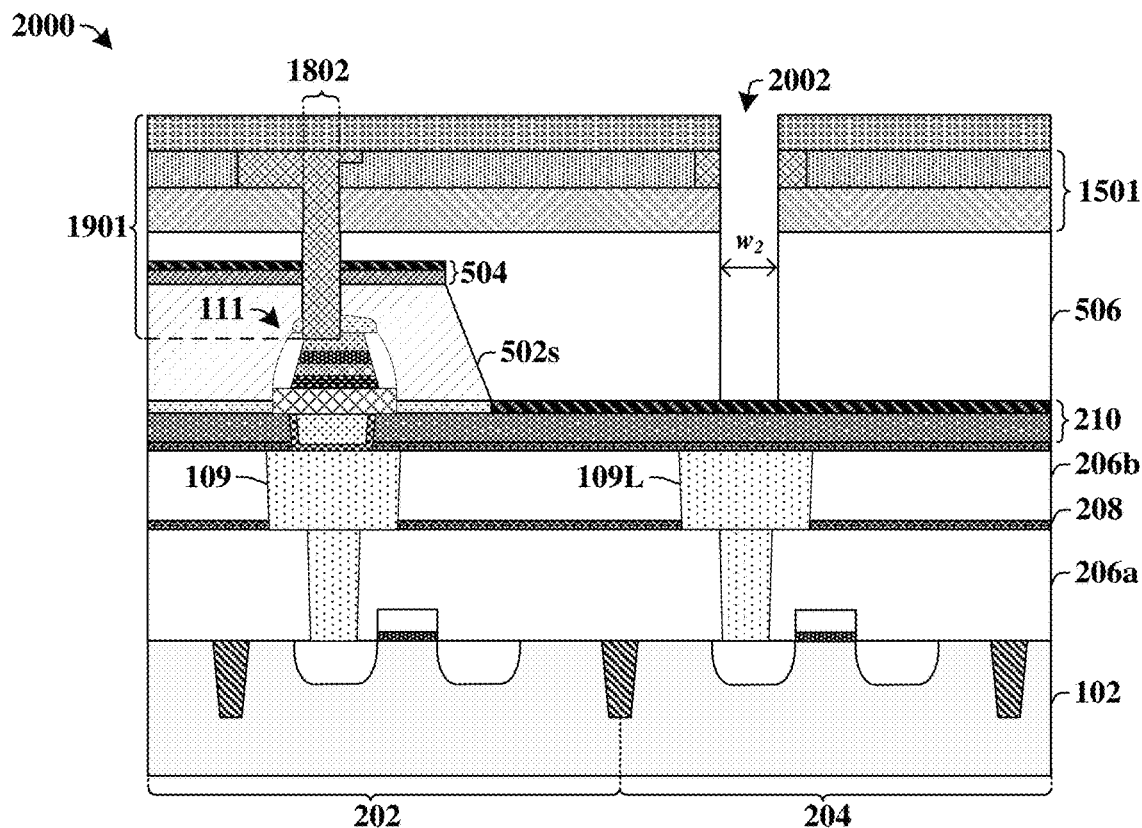

As shown in cross-sectional view 2000 of FIG. 20, a second etching process is performed according to the third patterning structure 1901 to define a via hole 2002. The via hole 2002 extends through the second upper ILD layer 506 to the lower insulating structure 210. In some embodiments, the via hole 2002 may have a second width $w_2$ that is in a range of between approximately 40 nm and approximately 60 nm. In some embodiments, the second width $w_2$ may be approximately equal to 45 nm.

Figure 21A:
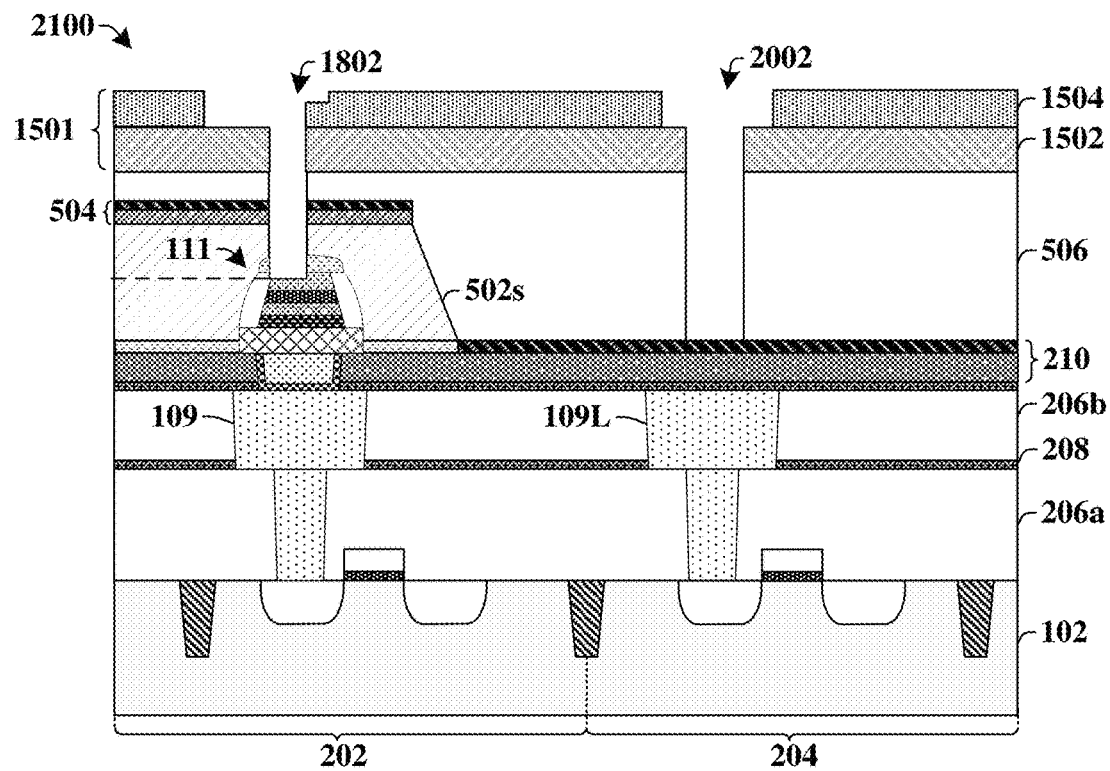
Figure 21B:
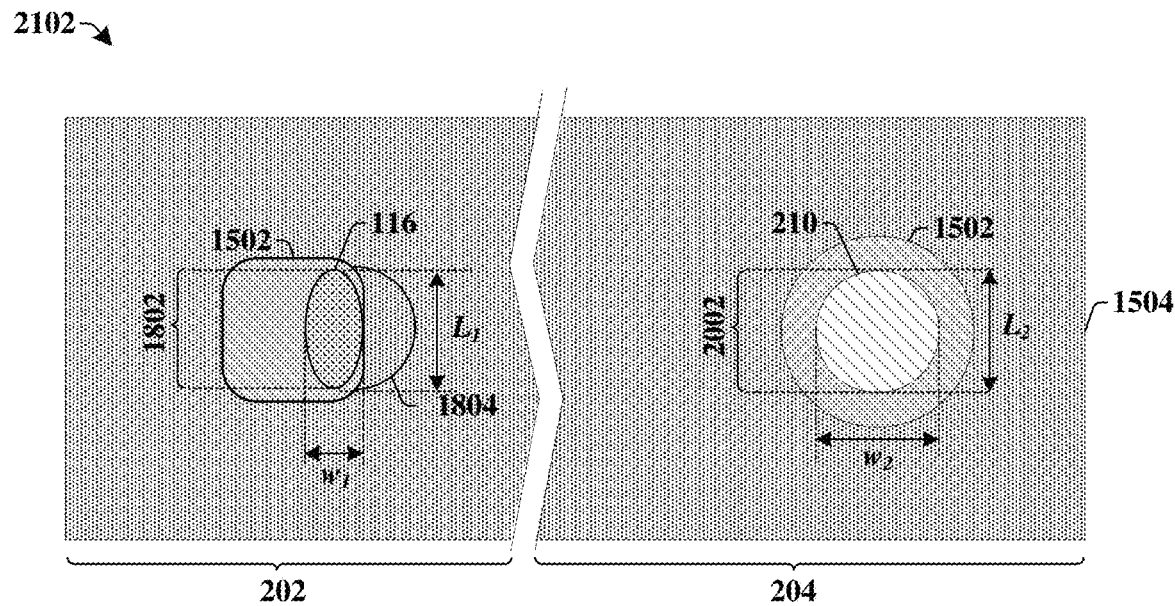

As shown in cross-sectional view 2100 of FIG. 21A, the third patterning structure (1901 of FIG. 20) is removed. In some embodiments, the third patterning structure may be removed by a plasma stripping/ashing process. FIG. 21B illustrates a top-view 2102 of the cross-sectional view 2100 of FIG. 21A.

Figure 22:
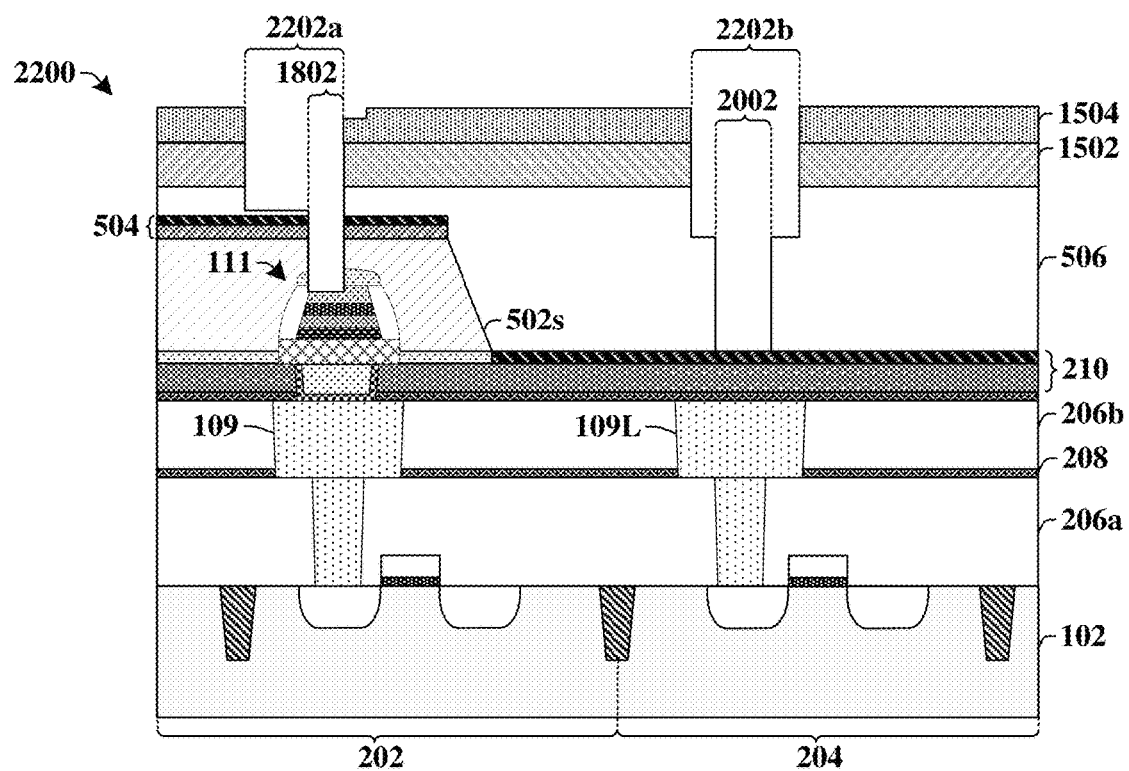

As shown in cross-sectional view 2200 of FIG. 22, a third etching process is performed to define a first interconnect trench 2202a within the embedded memory region 202 and a second interconnect trench 2202b within the logic region 204. In some embodiments, the third etching process removes parts of the lower hard mask layer 1502 that are not covered by the upper hard mask layer 1504. The fifth etching process causes the top electrode via hole 1802 to be aligned with a first sidewall of the second upper ILD layer 506 defining the first interconnect trench 2202a and to be misaligned with an opposing second sidewall of the second upper ILD layer 506 defining the first interconnect trench 2202a. The via hole 2002 is substantially centered with the second interconnect trench 2202b.

Figure 23:
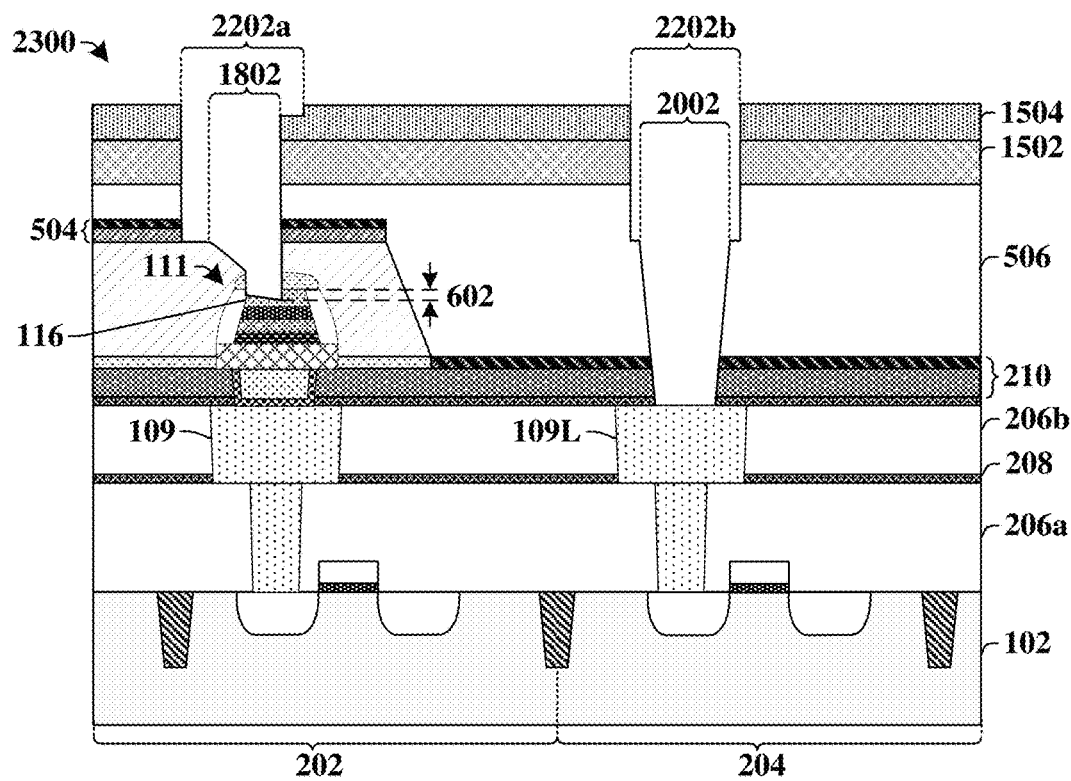

As shown in cross-sectional view 2300 of FIG. 23, a wet etching process is performed on the first upper ILD layer 502 and on the second upper ILD layer 506. The wet etching process removes residue and/or contaminants remaining after completion of the third etching process. The wet etching process may also remove parts of the first upper ILD layer 502 and the second upper ILD layer 506 that were damaged by the third etching process (e.g., by plasma damage). The wet etching process decreases slopes (i.e., increases an angle of the sidewalls relative to a vertical line) of sidewalls of the first upper ILD layer 502 and the second upper ILD layer 506. In some embodiments, the wet etching process may cause the top electrode via hole 1802 to extend a non-zero distance 602 below a top of a top electrode 116 within the MRAM device 111.

Figure 24:
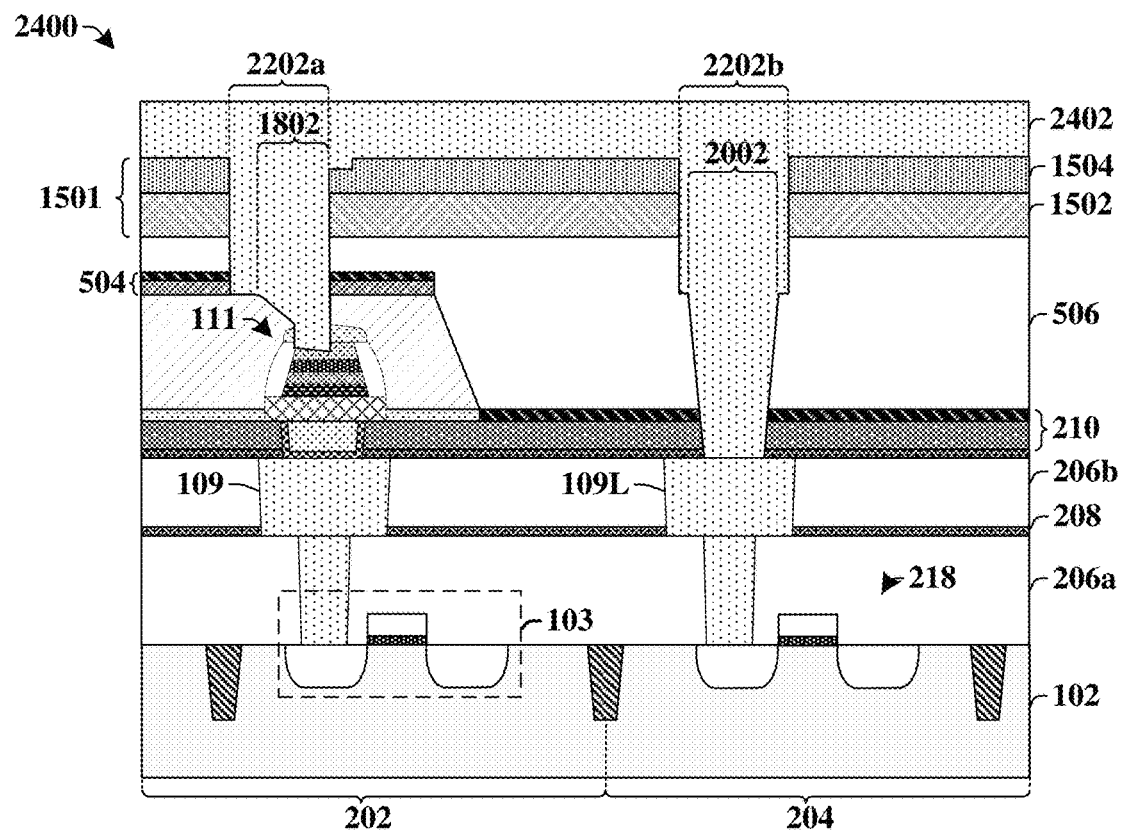

As shown in cross-sectional view 2400 of FIG. 24, a conductive material 2402 is formed within the top electrode via hole 1802, the via hole 2002, the first interconnect trench 2202a, and the second interconnect trench 2202b. The conductive material 2402 fills the top electrode via hole 1802, the via hole 2002, the first interconnect trench 2202a, and the second interconnect trench 2202b. In some embodiments, the conductive material may be deposited by a physical vapor deposition technique (e.g., PVD, CVD, PE-CVD, ALD, etc.) and a subsequent plating process (e.g., electroplating, electro-less plating, etc.). In various embodiments, the conductive material may comprise tungsten, copper, or aluminum copper, for example.

Figure 25:
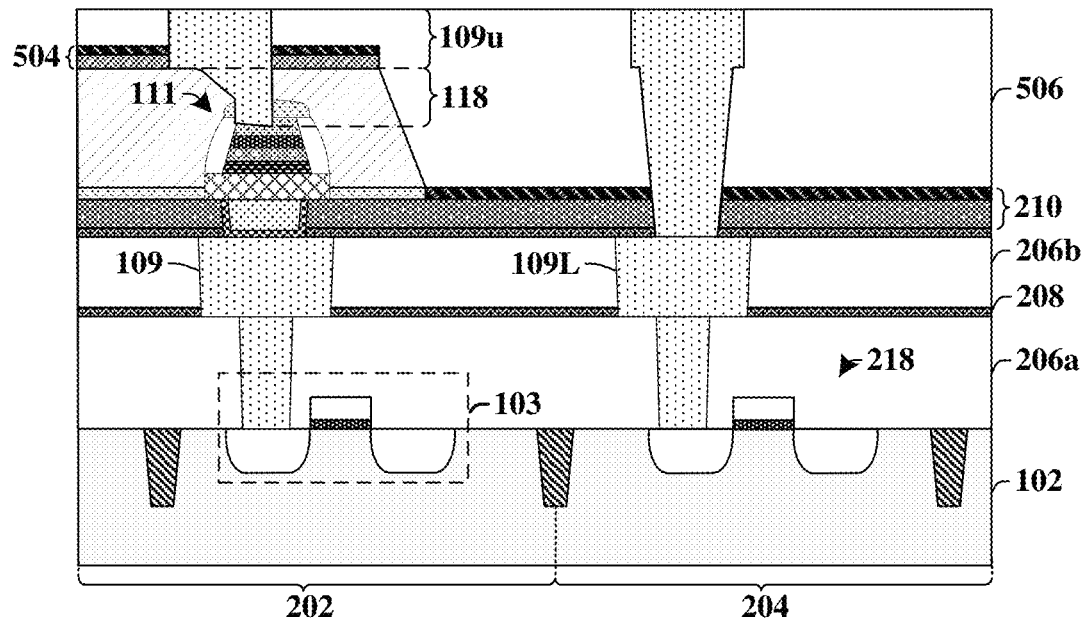

As shown in cross-sectional view 2500 of FIG. 25, a planarization process is performed. The planarization process removes excess of the conductive material (2402 of FIG. 24) from over the second upper ILD layer 506 to define an upper interconnect wire 109u. In some embodiments, the planarization process may also remove the hard mask structure (1501 of FIG. 24). In some embodiments, the planarization process may comprise a chemical mechanical planarization (CMP) process.

Figure 26:
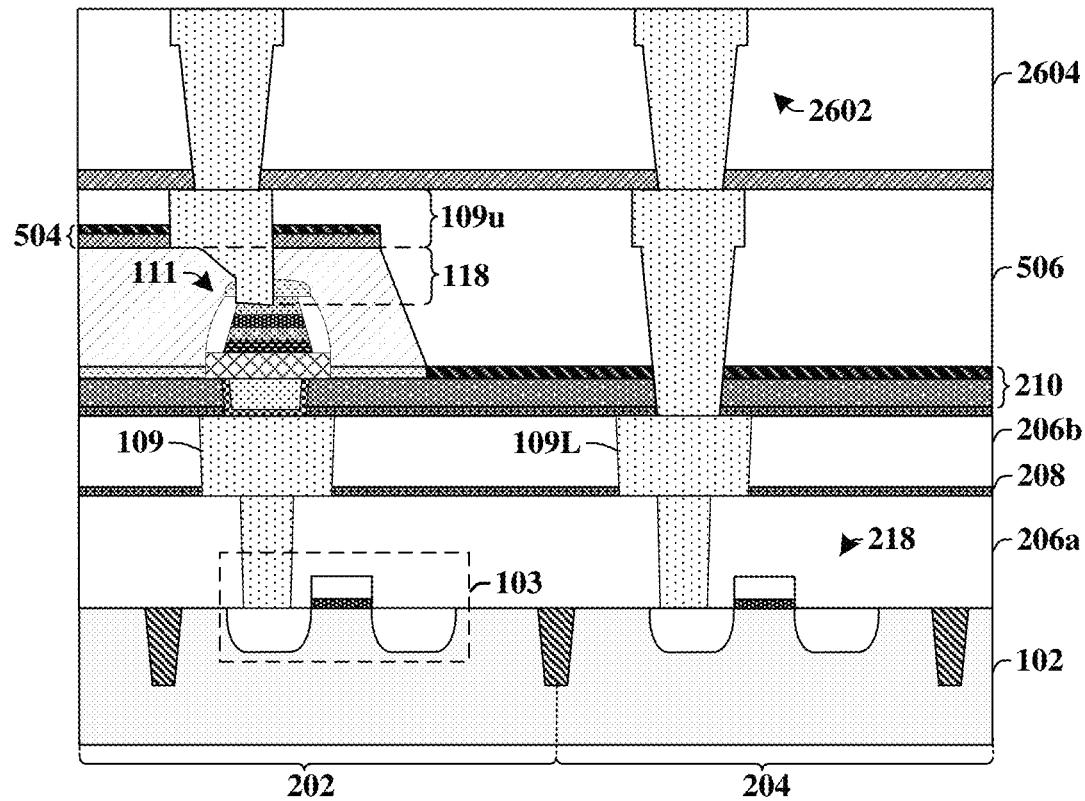

As shown in cross-sectional view 2600 of FIG. 26, one or more additional interconnect layers 2602 are formed over the upper interconnect wire 109u. In some embodiments, the one or more additional interconnect layers 2602 be formed by way of a damascene process. In such embodiments, an additional ILD layer 2604 is formed over the second upper ILD layer 506. The additional ILD layer 2604 is subsequently etched to form a via hole and/or trench, which is filled with a conductive material (e.g., tungsten, copper, and/or aluminum). A chemical mechanical planarization (CMP) process is subsequently performed to remove excess of the conductive material from over the additional ILD layer 2604.

Figure 27:
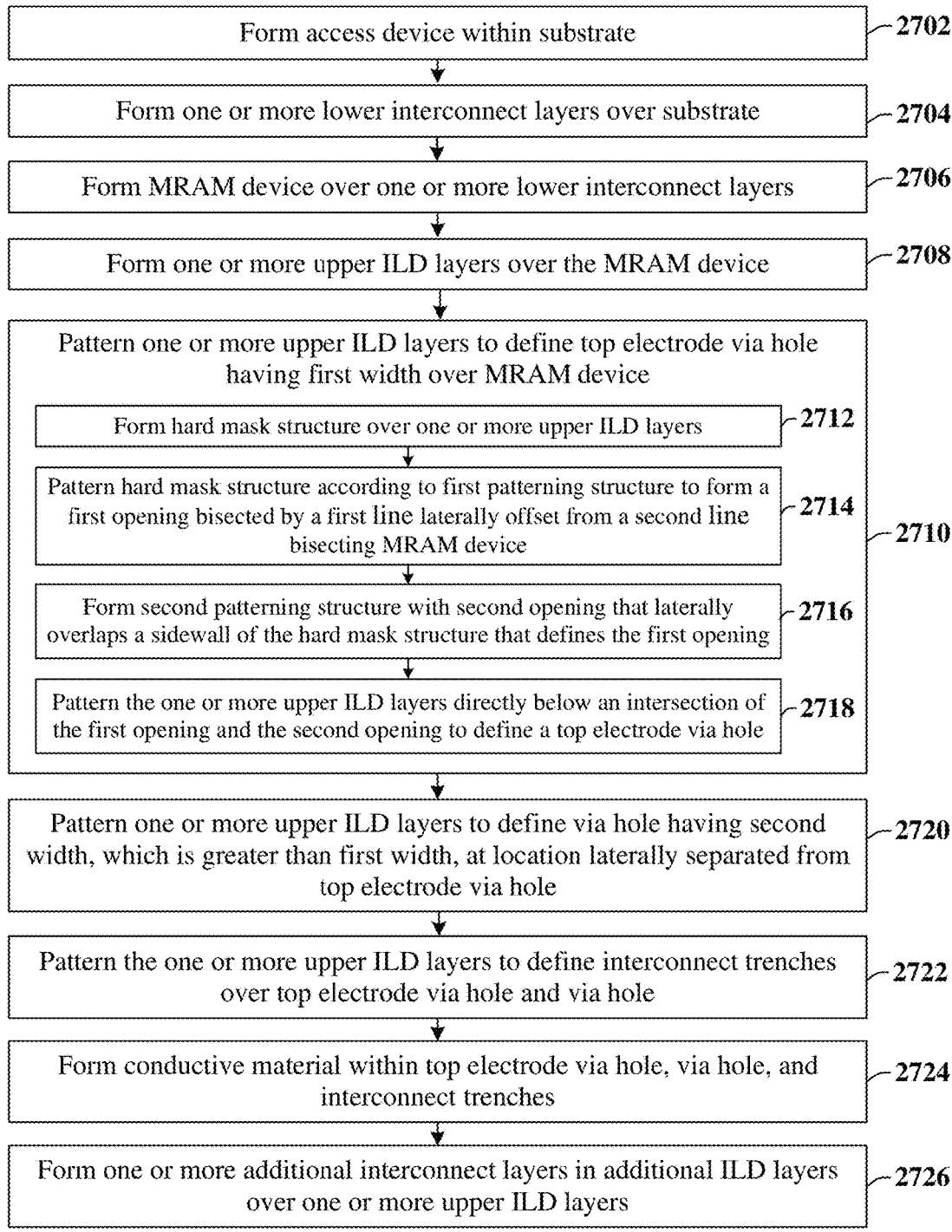
FIG. 27 illustrates a flow diagram of some embodiments of a method of forming an integrated chip having an MRAM cell comprising a top electrode via with a smaller width than an underlying bottom electrode via.

FIG. 27 illustrates a flow diagram of some embodiments of a method 2700 of forming an integrated chip having an MRAM cell comprising a top electrode via having a smaller width than an underlying bottom electrode via.

While method 2700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2702, an access device is formed within a substrate. FIG. 7 illustrates a cross-sectional view 700 of some embodiments corresponding to act 2702.

At 2704, one or more lower interconnect layers are formed over the substrate. FIG. 8 illustrates a cross-sectional view 800 of some embodiments corresponding to act 2704.

At 2706, an MRAM device is formed over the one or more lower interconnect layers. FIGS. 9-11 illustrate cross-sectional views 900-1100 of some embodiments corresponding to act 2706.

At 2708, one or more upper inter-level dielectric (ILD) layers are formed over the MRAM device. FIGS. 12-14 illustrate cross-sectional views 1200-1400 of some embodiments corresponding to act 2708.

At 2710, one or more upper inter-level dielectric (ILD) layers are patterned to define a top electrode via hole having first width over the MRAM device. In some embodiments, the top electrode via hole may be formed according to acts 2712-2718.

At 2712, a hard mask structure is formed over the one or more upper ILD layers. FIG. 15 illustrates a cross-sectional view 1500 of some embodiments corresponding to act 2712.

At 2714, the hard mask structure is patterned according to a first patterning structure to form a first opening bisected by a first line that is laterally offset from a second line bisecting the MRAM device. FIG. 16 illustrates a cross-sectional view 1600 of some embodiments corresponding to act 2714.

At 2716, a second patterning structure is formed having a second opening that laterally overlaps a sidewall of the hard mask structure defining the first opening. FIG. 17A illustrates a cross-sectional view 1700 of some embodiments corresponding to act 2716.

At 2718, the one or more upper ILD layers are patterned directly below an intersection of the first opening and the second opening to define a top electrode via hole. FIG. 18A illustrates a cross-sectional view 1800 of some embodiments corresponding to act 2718.

At 2720, the one or more upper ILD layers are patterned to define a via hole having a second width, which is greater than the first width, at location laterally separated from the top electrode via hole. FIG. 19A-21 illustrate cross-sectional views 1900-2100 of some embodiments corresponding to act 2720.

At 2722, the one or more upper ILD layers are patterned to define interconnect trenches over the top electrode via hole and over the via hole. FIGS. 22-23 illustrate cross-sectional views 2200-2300 of some embodiments corresponding to act 2722.

At 2724, a conductive material is formed within the top electrode via hole, the via hole, and the interconnect trenches. FIGS. 24-25 illustrate cross-sectional views 2400-2500 of some embodiments corresponding to act 2724.

At 2726, one or more additional interconnect wires are formed in additional ILD layers over the one or more upper ILD layers. FIG. 26 illustrates a cross-sectional view 2600 of some embodiments corresponding to act 2726.

Although method 2700 describes the formation of a top electrode via hole prior to the formation of an interconnect trench, it will be appreciated that in some alternative embodiments, the metal trench may be formed in the one or more upper ILD layers prior to the formation of the top electrode via hole. In such embodiments, an opening in a masking layer defining an interconnect trench straddles an opening in a masking layer defining a top electrode via hole.

Furthermore, although the disclosed figures and description are described in relation to magnetic random access memory (MRAM) devices, it will be appreciated that the disclosed reactivity reducing layer is not limited to such memory devices. Rather, in some alternative embodiments, the disclosed top electrode via may be formed over other types of memory devices such as, but not limited to, phase change random access memory (PCRAM), resistive random access memory (RRAM), ferroelectric random access memory (FRAM), programmable metallization memory, carbon nanotube memory, or the like.

Accordingly, in some embodiments, the present disclosure relates to an integrated chip comprising an MRAM cell having a top electrode via with a size that is smaller than a minimum feature size defined by a characteristics of a photolithography system, and an associated method of formation.

In some embodiments, the present disclosure relates to an integrated chip. The integrated chip includes a magnetoresistive random access memory (MRAM) device surrounded by a dielectric structure disposed over a substrate, the MRAM device including a magnetic tunnel junction disposed between a bottom electrode and a top electrode; a bottom electrode via coupling the bottom electrode to a lower interconnect wire; and a top electrode via coupling the top electrode to an upper interconnect wire, a bottom surface of the top electrode via having a first width that is smaller than a second width of a bottom surface of the bottom electrode via. In some embodiments, a first line is tangent to a first outermost sidewall of the top electrode via and a second line is tangent to an opposing second outermost sidewall of the top electrode via; and the first line is oriented at a first angle with respect to a horizontal plane that is parallel to an upper surface of the substrate and the second line is oriented at a second angle with respect to the horizontal plane, the second angle less than the first angle. In some embodiments, the bottom surface of the top electrode via has a non-zero slope. In some embodiments, the bottom surface of the top electrode via has an oval shape. In some embodiments, the top electrode via is asymmetric with respect to a line bisecting the top electrode via as viewed along a cross-sectional view of the top electrode via. In some embodiments, the top electrode via has a first sidewall that is substantially linear along a cross-sectional view of the top electrode via and an opposing sidewall that is curved along the cross-sectional view. In some embodiments, the top electrode via is centered along a first axis that is perpendicular to an upper surface of the substrate; and the upper interconnect wire is centered along a second axis that is perpendicular to the upper surface of the substrate and that is separated from the first axis by a non-zero distance. In some embodiments, the bottom surface of the top electrode via has the first width along a first direction and a first length along a second direction that is perpendicular to the first direction; and the first length is greater than the first width. In some embodiments, the first length is between approximately 150% and approximately 300% greater than the first width. In some embodiments, the bottom surface of the top electrode via is below a top of the top electrode. In some embodiments, the first width of the bottom surface of the top electrode via is less than ⅓ a third width of the top electrode via. In some embodiments, the integrated chip further includes a lower insulating structure laterally surrounding the bottom electrode via; a first upper inter-level dielectric (ILD) layer laterally surrounding the MRAM device; and a second upper ILD layer disposed over the first upper ILD layer and laterally contacting an angled sidewall of the first upper ILD layer, the top electrode via extends through the first upper ILD layer and the upper interconnect wire extends through the second upper ILD layer.

In other embodiments, the present disclosure relates to an integrated chip. The integrated chip includes a bottom electrode arranged over a substrate; a magnetic tunnel junction disposed over the bottom electrode; a top electrode disposed over the magnetic tunnel junction; a top electrode via disposed on the top electrode, the top electrode via centered along a first axis that is perpendicular to an upper surface of the substrate; and an upper interconnect wire contacting a top of the top electrode via, the upper interconnect wire centered along a second axis that is perpendicular to the upper surface of the substrate and that is laterally separated from the first axis by a non-zero distance. In some embodiments, the integrated chip further includes a lower interconnect wire arranged within a lower ILD layer below the bottom electrode; and a lower insulating layer arranged on the lower ILD layer and laterally surrounding a bottom electrode via coupling the lower interconnect wire to the bottom electrode, a bottom surface of the top electrode via having a first width that is smaller than a second width of the bottom electrode via. In some embodiments, the integrated chip further includes an additional interconnect via laterally separated from the magnetic tunnel junction along a horizontal plane that is parallel to the upper surface of the substrate, a bottom surface of the top electrode via having a first width that is smaller than a second width of a bottom surface of the additional interconnect via. In some embodiments, the top electrode via has a different shape than the additional interconnect via when viewed from a top-view of the top electrode via and the additional interconnect via. In some embodiments, the top electrode has interior surfaces that define a recess within a curved upper surface of the top electrode, the top electrode via contacting one or more of the interior surfaces. In some embodiments, the top electrode via includes a conductive material surrounded by a liner.

In yet other embodiments, the present disclosure relates to a method of forming an integrated chip. The method includes forming an upper ILD layer over an MRAM device over a substrate; forming a hard mask structure over the upper ILD layer, the hard mask structure having sidewalls defining a first opening that is directly over the MRAM device and that is centered along a first line perpendicular to an upper surface of the substrate; forming a patterning structure over the hard mask structure, the patterning structure having sidewalls defining a second opening that is directly over the MRAM device and that is centered along a second line perpendicular to the upper surface of the substrate, the second line laterally offset from the first line by a non-zero distance; etching the upper ILD layer directly below an intersection of the first opening and the second opening to define a top electrode via hole; and filling the top electrode via hole with a conductive material. In some embodiments, the second opening extends past the first opening in a first direction and the first opening extends past the second opening in an opposite second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a memory device surrounded by a dielectric structure disposed over a substrate, wherein the memory device comprises a data storage structure disposed between a bottom electrode and a top electrode;
   a top electrode via coupling the top electrode to an upper interconnect wire;
   wherein a first line is tangent to a first outermost sidewall of the top electrode via and a second line is tangent to an opposing second outermost sidewall of the top electrode via; and
   wherein the first line is oriented at a first angle with respect to a horizontal plane that is parallel to an upper surface of the substrate and the second line is oriented at a second angle with respect to the horizontal plane, the second angle less than the first angle.

2. The integrated chip of claim 1, wherein the second outermost sidewall is a curved sidewall.

3. The integrated chip of claim 1,
   wherein the top electrode via has a bottom surface; and
   wherein the top electrode via laterally extends a first distance past a first edge of the bottom surface and a second distance past an opposing second edge of the bottom surface, the first distance being larger than the second distance.

4. The integrated chip of claim 1, wherein the top electrode via has a bottom surface that is centered along a vertical line, the vertical line offset from a center of the top electrode via by a non-zero distance.

5. The integrated chip of claim 1,
   wherein a bottom surface of the top electrode via extends for a first distance in a first direction and for a second distance in a second direction, the second distance larger than the first distance; and
   wherein the first direction and the second direction are parallel to the upper surface of the substrate.

6. The integrated chip of claim 1, wherein a top of the top electrode via is off centered from a bottom of the top electrode via.

7. The integrated chip of claim 1, wherein the top electrode via has a first width extending from the first outermost sidewall to the second outermost sidewall, the first width being less than or equal to approximately 25 nm.

8. The integrated chip of claim 1, further comprising:
   a second via disposed within the dielectric structure and laterally separated from the top electrode via, wherein the top electrode via has a first width and the second via has a second width that is larger than the first width.

9. The integrated chip of claim 8, wherein the top electrode via has a first height and the second via has a second height that is larger than the first height.

10. An integrated chip, comprising:
    a memory device laterally surrounded by an inter-level dielectric (ILD) layer disposed over a substrate, wherein the memory device comprises a data storage structure disposed between a bottom electrode and a top electrode; and
    a top electrode via coupling the top electrode to an upper interconnect wire, wherein a bottom surface of the top electrode via has an oval shape.

11. The integrated chip of claim 10, further comprising:
    a second via laterally separated from the top electrode via by the ILD layer, wherein the top electrode via has a first width and the second via has a second width that is larger than the first width.

12. The integrated chip of claim 10, further comprising:

a second via laterally separated from the top electrode via by the ILD layer, wherein the second via has a different shape than the top electrode via as viewed along a top-view.

13. The integrated chip of claim 10, wherein the top electrode via extends below a top of the top electrode.

14. The integrated chip of claim 10, wherein a top of the top electrode via is at least twice as wide as a bottom of the top electrode via.

15. An integrated chip, comprising:

a memory device laterally surrounded by an inter-level dielectric (ILD) material disposed over a substrate, wherein the memory device comprises a data storage structure disposed between a bottom electrode and a top electrode; and a top electrode via coupling the top electrode to an upper interconnect wire, wherein the top electrode via is asymmetric with respect to a line bisecting the top electrode via as viewed along a cross-sectional view of the top electrode via.

16. The integrated chip of claim 15, wherein the top electrode via has a bottom surface; and wherein the top electrode via laterally extends past the bottom surface in a first direction for a first distance and the top electrode via laterally extends past the bottom surface in an opposing second direction for a second distance that is larger than the first distance.

17. The integrated chip of claim 15, wherein a side of the top electrode via is defined by a slope that decreases as a distance from the top electrode increases.

18. The integrated chip of claim 15, wherein a first side of the top electrode via has a first slope and an opposing second side of the top electrode via has a second slope that is greater than the first slope.

19. The integrated chip of claim 15, wherein a bottom of the top electrode via is off centered from a top of the top electrode via.

20. The integrated chip of claim 15, further comprising:

a second via laterally separated from the top electrode via by the ILD material, wherein a bottom surface of the second via has a larger width than a bottom surface of the top electrode via.

* * * * *